US010559592B1

(12) United States Patent
Liu et al.

(10) Patent No.: US 10,559,592 B1
(45) Date of Patent: Feb. 11, 2020

(54) MEMORY DEVICE AND FORMING METHOD THEREOF

(71) Applicant: Yangtze Memory Technologies Co., Ltd., Wuhan, Hubei (CN)

(72) Inventors: Jun Liu, Hubei (CN); Zongliang Huo, Hubei (CN)

(73) Assignee: Yangtze Memory Technologies Co., Ltd., Wuhan, Hubei (CN)

( * ) Notice: Subject to any disclaimer, the term of this patent is extended or adjusted under 35 U.S.C. 154(b) by 0 days.

(21) Appl. No.: 16/126,283

(22) Filed: Sep. 10, 2018

Related U.S. Application Data

(63) Continuation of application No. PCT/CN2018/099352, filed on Aug. 8, 2018.

(51) Int. Cl.
*H01L 27/11582* (2017.01)
*H01L 23/528* (2006.01)
(Continued)

(52) U.S. Cl.
CPC .. *H01L 27/11582* (2013.01); *H01L 21/76802* (2013.01); *H01L 21/76877* (2013.01);
(Continued)

(58) Field of Classification Search
CPC ......... H01L 27/11582; H01L 21/76802; H01L 21/76877; H01L 23/528; H01L 23/53257;
(Continued)

(56) References Cited

U.S. PATENT DOCUMENTS 8,946,665 B2 2/2015 Shim et al.
9,449,987 B1 9/2016 Miyata et al.
(Continued)

FOREIGN PATENT DOCUMENTS

CN 103050445 A 4/2013
CN 103545276 A 1/2014
(Continued)

OTHER PUBLICATIONS

International Search Report and Written Opinion of the International Searching Authority directed to related International Patent Application No. PCT/CN2018/099352, dated May 8, 2019; 10 pages.

*Primary Examiner* — Scott B Geyer
(74) *Attorney, Agent, or Firm* — Sterne, Kessler, Goldstein & Fox P.L.L.C.

(57) ABSTRACT

Methods and structures of a three-dimensional memory device are disclosed. In an example, the memory device includes a substrate and a first alternating conductor/dielectric stack disposed on the substrate and a dielectric layer disposed over the first alternating conductor/dielectric stack. A second alternating conductor/dielectric stack is disposed on the dielectric layer. The NAND memory device includes one or more array common source contacts extending orthogonally with respect to the surface of the substrate through the first layer stack and the second layer stack, wherein at least one of the one or more array common source contacts includes a first conductive contact and a second conductive contact that is disposed over and electrically connected with the first conductive contact.

20 Claims, 22 Drawing Sheets

(51) Int. Cl.
  *H01L 23/532* (2006.01)
  *H01L 21/768* (2006.01)
  *H01L 21/311* (2006.01)
  *H01L 21/321* (2006.01)
  *H01L 21/3105* (2006.01)

(52) U.S. Cl.
  CPC ........ *H01L 23/528* (2013.01); *H01L 23/5329* (2013.01); *H01L 23/53257* (2013.01); *H01L 21/31053* (2013.01); *H01L 21/31116* (2013.01); *H01L 21/3212* (2013.01); *H01L 21/7684* (2013.01); *H01L 21/76819* (2013.01)

(58) Field of Classification Search
  CPC ........... H01L 23/5329; H01L 21/31053; H01L 21/31116; H01L 21/3212; H01L 21/76819; H01L 21/7684; H01L 27/115–11597; H01L 25/0657
  See application file for complete search history.

(56) References Cited

U.S. PATENT DOCUMENTS

| | | | |
|---|---|---|---|
| 9,502,471 B1 | 11/2016 | Lu et al. | |
| 9,853,043 B2 | 12/2017 | Lu et al. | |
| 10,038,006 B2 | 7/2018 | Furihata et al. | |
| 10,388,666 B1* | 8/2019 | Kai | H01L 23/5283 |
| 2015/0311214 A1 | 10/2015 | Yoo et al. | |
| 2016/0056171 A1* | 2/2016 | Manorotkul | H01L 27/11526 |
| | | | 257/66 |
| 2016/0104715 A1 | 4/2016 | Pachamuthu et al. | |
| 2017/0229472 A1 | 8/2017 | Lu et al. | |
| 2017/0287926 A1 | 10/2017 | Ariyoshi | |
| 2018/0182771 A1 | 6/2018 | Costa et al. | |
| 2018/0366482 A1* | 12/2018 | Zhou | H01L 27/11556 |
| 2019/0280003 A1* | 9/2019 | Mushiga | H01L 29/40114 |

FOREIGN PATENT DOCUMENTS

| | | |
|---|---|---|
| CN | 107731838 A | 2/2018 |
| CN | 107771356 A | 3/2018 |
| CN | 107810552 A | 3/2018 |
| CN | 108028223 A | 5/2018 |
| CN | 108377660 A | 8/2018 |
| TW | 201603229 A | 1/2016 |

* cited by examiner

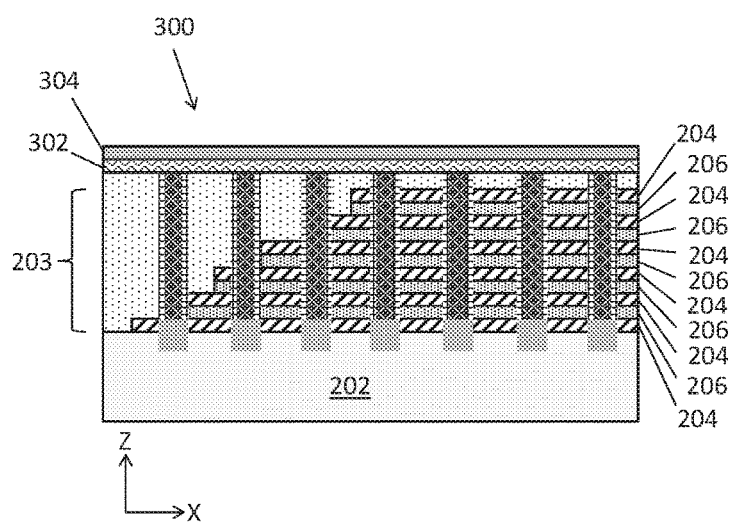
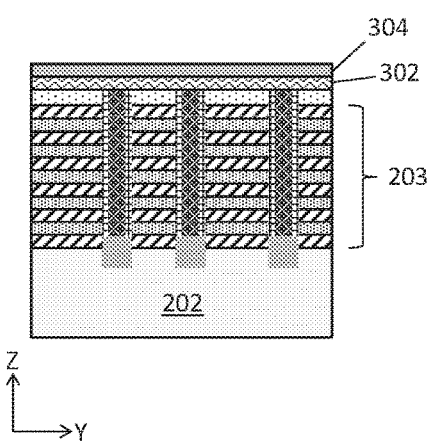
FIG. 3A
FIG. 3B

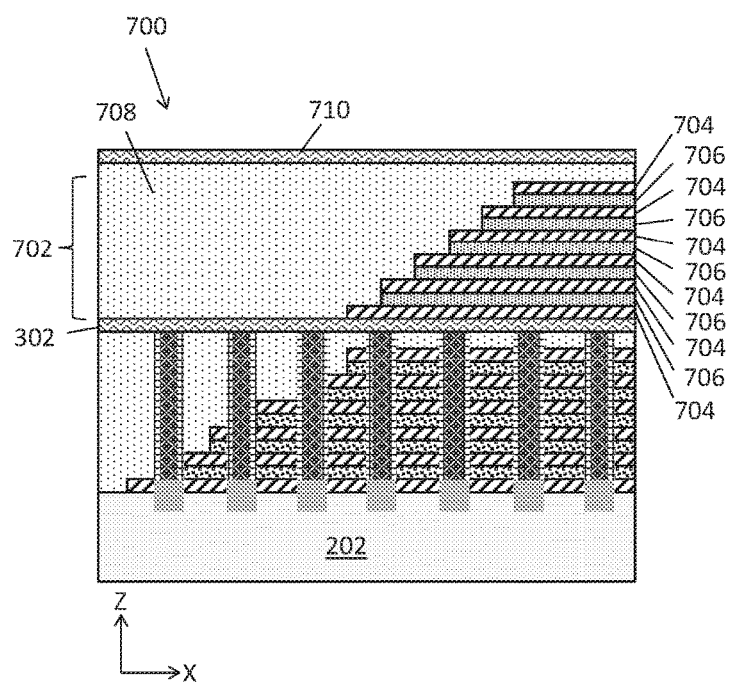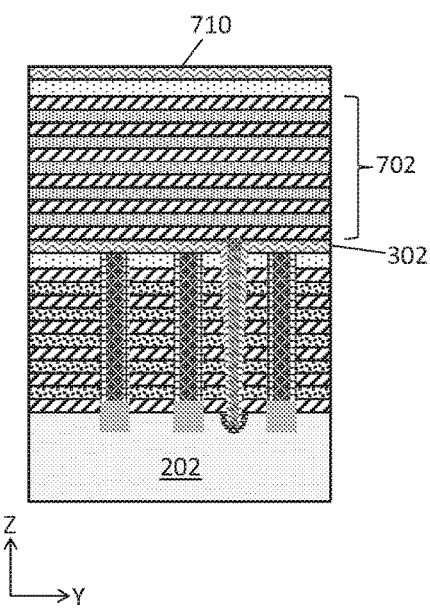
FIG. 7A
FIG. 7B

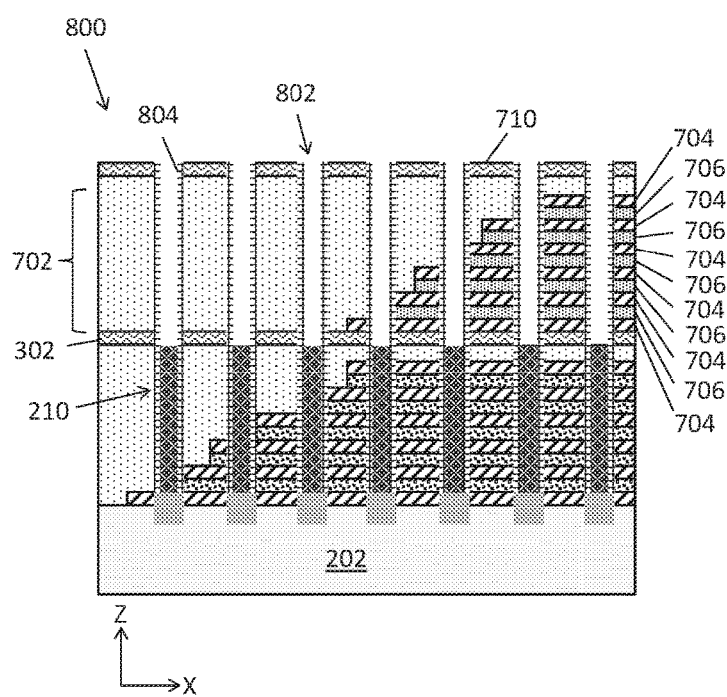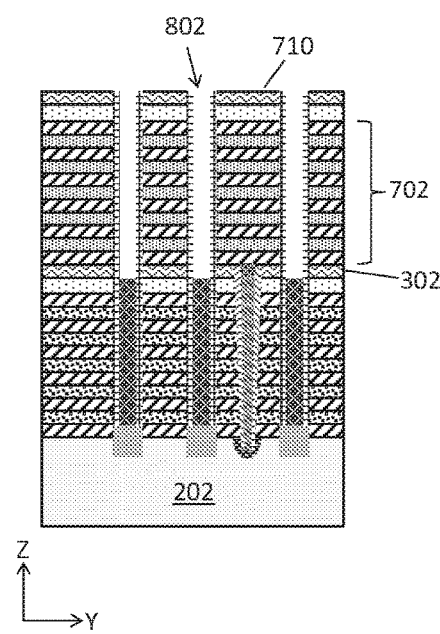
FIG. 8A
FIG. 8B

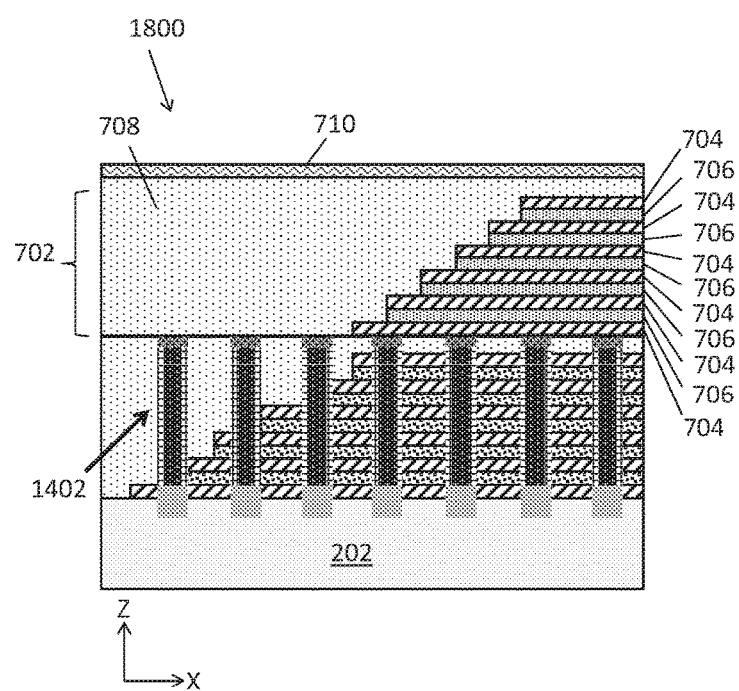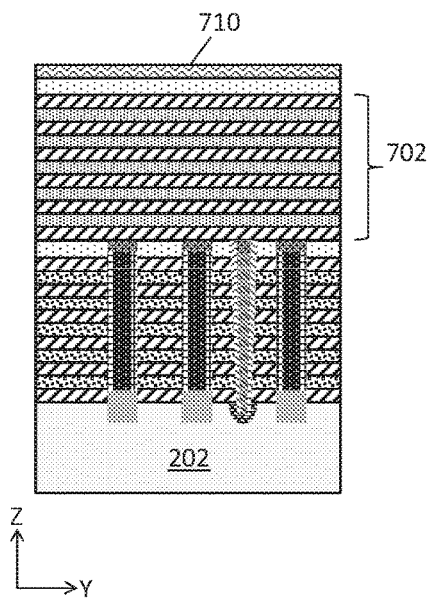
FIG. 18A
FIG. 18B

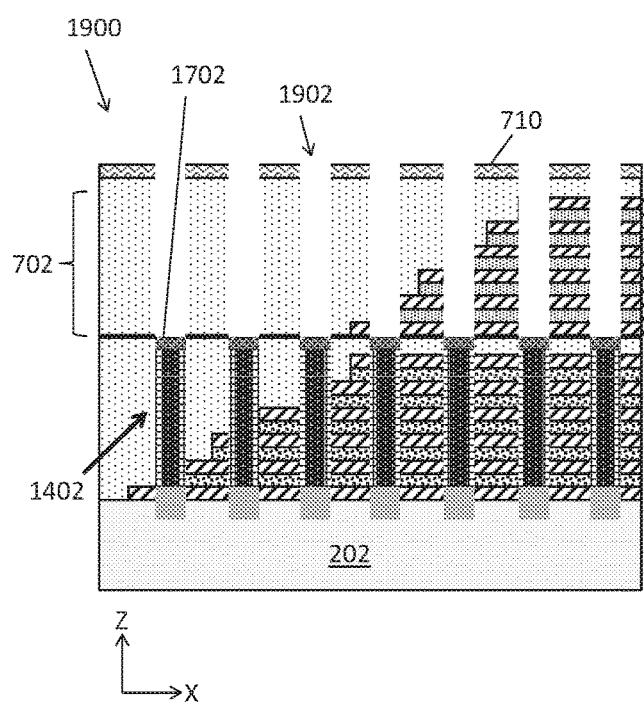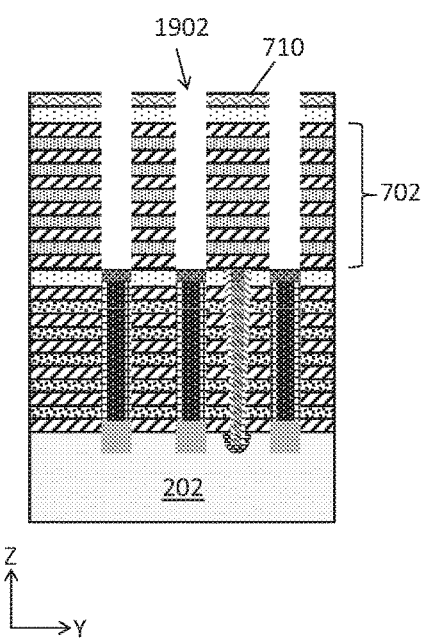
FIG. 19A
FIG. 19B

MEMORY DEVICE AND FORMING METHOD THEREOF

BACKGROUND

Embodiments of the present disclosure relate to three-dimensional (3D) memory devices and fabrication methods thereof.

Flash memory devices have undergone rapid development. Flash memory devices can store data for a considerably long time without powering (i.e., they are a form of non-volatile memory), and have advantages such as high integration level, fast access, easy erasing, and rewriting. To further improve the bit density and reduce cost of flash memory devices, three-dimensional NAND flash memory devices have been developed.

A three-dimensional NAND flash memory device includes a stack of gate electrodes arranged over a substrate, with a plurality of semiconductor channels through and intersecting word lines, into the p- and/or n-type implanted substrate. The bottom/lower gate electrodes function as bottom/lower selective gates (BSG). The top/upper gate electrodes function as top/upper selective gates (TSG). Back-End-of Line (BEOL) Metal plays the role of Bit-Lines (BLs), The word lines/gate electrodes between the top/upper selective gate electrodes and the bottom/lower gate electrodes function as word lines (WLs). The intersection of a word line and a semiconductor channel forms a memory cell. WLs and BLs are typically laid perpendicular to each other (e.g., in an X-direction and a Y-direction), and TSGs are laid in a direction perpendicular to both the WLs and BLs (e.g., in a Z-direction.)

BRIEF SUMMARY

Embodiments of three-dimensional memory device architectures and fabrication methods therefore are disclosed herein. The disclosed structures and methods provide numerous benefits, including, but not limited to lower stress during fabrication and a lower bending of the layers during fabrication.

In some embodiments, a memory device includes a substrate and a first alternating conductor/dielectric stack disposed on the substrate and a dielectric layer disposed over the first alternating conductor/dielectric stack. A second alternating conductor/dielectric stack is disposed on the dielectric layer. The NAND memory device includes one or more array common source contacts extending orthogonally with respect to the surface of the substrate through the first layer stack and the second layer stack, wherein at least one of the one or more array common source contacts includes a first conductive contact and a second conductive contact that is disposed over and electrically connected with the first conductive contact.

In some embodiments, at least one of the one or more array common source contacts further includes a first conductive material disposed over the first conductive contact and surrounding one end of the second conductive contact.

In some embodiments, the first conductive material includes polysilicon.

In some embodiments, the memory device includes one or more first NAND strings extending through the first layer stack and one or more second. NAND strings extending through the second layer stack. Each of the one or more second NAND strings is disposed over a respective NAND string of the one or more first NAND strings.

In some embodiments, each of the one or more first NAND strings and one or more second NAND strings includes an inner semiconductor channel and one or more outer dielectric layers.

In some embodiments, the one or more outer dielectric layers includes at least one oxide layer and at least one nitride layer.

In some embodiments, the memory device further includes a second conductive material disposed between each of the one or more first NAND strings and one or more second NAND strings, where at least a portion of the second conductive material is disposed through the capping dielectric layer.

In some embodiments, the second conductive material includes polysilicon.

In some embodiments, the one or more second NAND strings includes a layer of poly silicon at an end of the one or more second NAND strings away from the surface of the substrate.

In some embodiments, the memory device includes one or more NAND strings extending through the first layer stack and the second layer stack.

In some embodiments, each of the one or more NAND strings includes an inner semiconductor channel and one or more outer dielectric layers.

In some embodiments, the one or more outer dielectric layers includes at least one oxide layer and at least one nitride layer.

In some embodiments, the one or more NAND strings includes a layer of polysilicon at an end of the one or more NAND strings away from the surface of the substrate.

In some embodiments, the first conductive contact extends into a doped region in the substrate.

In some embodiments, each of the first conductive contact and the second conductive contact includes tungsten.

In some embodiments, the first layer stack and the second layer stack include alternating layers of oxide and tungsten.

In some embodiments, the first layer stack and the second layer stack include alternating layers of vacuum and tungsten.

In some embodiments, the first layer stack and the second layer stack are arranged in a staircase pattern.

In some embodiments, a method for forming a NAND memory device includes forming a first alternating sacrificial dielectric stack over a substrate. The method further includes forming a capping dielectric layer over the first alternating sacrificial dielectric stack, and forming one or more first openings through the capping dielectric layer and through the first alternating sacrificial dielectric stack. The method further includes forming one or more first conductive contacts in the one or more first openings, and forming a second alternating sacrificial dielectric stack over the dielectric layer. The method also includes forming one or more second openings through the second alternating sacrificial dielectric stack. The one or more second openings are aligned with the one or more first conductive contacts. The method also includes forming one or more second conductive contacts in the one or more second openings. An ohmic contact is formed between the one or more first conductive contacts and the one or more second conductive contacts, the first conductive contacts and second conductive contacts together forming respective array common source contacts.

In some embodiments, the method further includes forming one or more third openings through the first layer stack, the one or more third openings forming corresponding recesses in the substrate, forming a material in the corresponding recesses, and forming one or more first NAND strings in the one or more first openings.

In some embodiments, the method further includes forming one or more recesses through the capping dielectric layer over the one or more first NAND strings, and filling the one or more recesses with a conductive material.

In some embodiments, the conductive material includes polysilicon.

In some embodiments, the method further includes forming one or more fourth openings through the second layer stack, the one or more fourth openings being aligned with the one or more first NAND strings, and forming one or more second NAND strings in the one or more fourth openings.

In some embodiments, the method further includes forming one or more third openings through the first layer stack, the one or more third openings forming corresponding recesses in the substrate, forming a material in the corresponding recesses, and forming one or more vertical sacrificial structures in the one or more third openings.

In some embodiments, the method further includes forming one or more fourth openings through the second layer stack, the one or more fourth openings being aligned with the one or more vertical sacrificial structures, removing the one or more vertical sacrificial structures from the one or more third openings, and forming one or more NAND strings in the one or more third openings and in the one or more fourth openings aligned with the one or more third openings.

In some embodiments, the method further includes, after forming the one or more first openings, removing the sacrificial layers from the first layer stack, and replacing the removed sacrificial layers with conductive layers.

In some embodiments, the removing the sacrificial layers includes removing nitride layers from the first layer stack and the replacing includes replacing the nitride layers with tungsten.

In some embodiments, the method further includes, after forming the one or more first conductive contacts, removing a portion of the one or more first conductive contacts, and forming polysilicon over the one or more first conductive contacts.

In some embodiments, forming the one or more second openings further includes forming the one or more second openings through the polysilicon.

In some embodiments, forming the one or more second conductive contacts includes forming the one or more second conductive contacts such that the polysilicon surrounds a lower end of the one or more second conductive contacts.

In some embodiments, the method further includes, after forming the one or more second openings, removing the sacrificial layers from the second alternating sacrificial dielectric stack, and replacing the removed plurality of dielectric layers with a plurality of conductive layers.

In some embodiments, the plurality of dielectric layers includes nitride and the plurality of conductive layers includes tungsten.

In some embodiments, the method further includes, after forming the one or more first openings, doping a portion of the substrate exposed by e one or more first openings.

The three-dimensional memory device provided by the present disclosure is fabricated using a process that reduces stress and strain on the stacked layers during the fabrication process. The fabrication of multiple gate layers is performed in two separate stages, with contact openings and gate line slits being formed in a stacked configuration between the two stages, according to an embodiment. By forming the stacked components of the NAND memory device in separate stages, the aspect ratio of each etching process can be reduced, and the overall stress and/or strain on the layers can be reduced.

BRIEF DESCRIPTION OF THE DRAWINGS

Aspects of the present disclosure are best understood from the following detailed description when reading with the accompanying figures. It is noted that, in accordance with the common practice in the industry, various features are not drawn to scale. In fact, the dimensions of the various features may be arbitrarily increased or reduced for clarity of illustration and discussion.

FIGS. 3A and 3B illustrate side views of a three-dimensional memory structure at a stage of an exemplary fabrication process, according to some embodiments.

FIGS. 7A and 7B illustrate side views of a three-dimensional memory structure at a stage of an exemplary fabrication process, according to some embodiments.

FIGS. 8A and 8B illustrate side views of a three-dimensional memory structure at a stage of an exemplary fabrication process, according to some embodiments.

FIGS. 18A and 18B illustrate side views of another three-dimensional memory structure at a stage of an exemplary fabrication process, according to some embodiments.

FIGS. 19A and 19B illustrate side views of another three-dimensional memory structure at a stage of an exemplary fabrication process, according to some embodiments.

DETAILED DESCRIPTION

Figure 1:
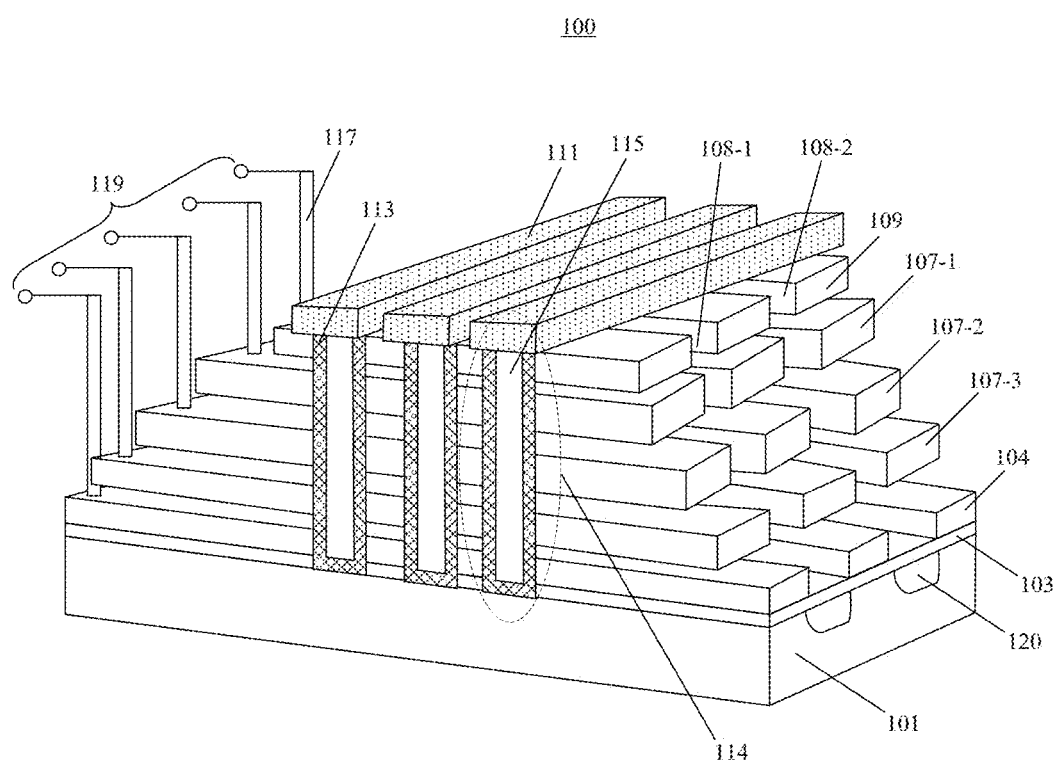
FIG. 1 is an illustration of a three-dimensional memory device.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow, A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

Any of the memory devices described herein can be used in an electronic system, such as, for example, portable electronics, computers, or wearable electronics.

FIG. 1 illustrates a portion of a three-dimensional NAND flash memory device 100. The flash memory device 100 includes a substrate 101, an insulating layer 103 over substrate 101, a tier of lower selective gate electrodes 104 over the insulating layer 103, and a plurality of tiers of control gate electrodes 107 stacking on top of bottom selective gate electrodes 104 to form an alternating conductor/dielectric stack. The flash memory device also includes a tier of upper selective gate electrodes 109 over the stack of control gate electrodes 107, doped source line regions 120 in portions of substrate 101 between adjacent lower selective gate electrodes 104, and NAND strings 114 through upper selective gate electrodes 109, control gate electrodes 107, lower selective gate electrodes 104, and insulating layer 103. NAND strings 114 includes a memory film 113 over the inner surface of NAND strings 114 and a core filling film 115 surrounded by memory film 113. The flash memory device 100 further includes a plurality of bit lines 111 connected to NAND strings 114 over upper selective gate electrodes 109 and a plurality, of metal interconnects 119 connected to the gate electrodes through a plurality of metal contacts 117. Insulating layers between adjacent tiers of gate electrodes are not shown in FIG. 1 for clarity. The gate electrodes include upper selective gate electrodes 109, control gate electrodes 107 (e.g., also referred to as the word lines), and lower selective gate electrodes 104.

In FIG. 1, for illustrative purposes, three tiers of control gate electrodes 107-1, 107-2, and 107-3 are shown together with one tier of upper selective gate electrodes 109 and one tier of lower selective gate electrodes 104. Each tier of gate electrodes have substantially the same height over substrate 101. The gate electrodes of each tier are separated by gate line slits 108-1 and 108-2 through the stack of gate electrodes. Each of the gate electrodes in a same tier is conductively connected to a metal interconnect 119 through a metal contact 117. That is, the number of metal contacts formed on the gate electrodes equals the number of gate electrodes (i.e., the sum of all upper selective gate electrodes 109, control gate electrodes 107, and lower selective gate electrodes 104). Further, the same number of metal interconnects is formed to connect to each metal contact via. In some arrangements, additional metal contacts are formed to connect to other structures beyond the gate electrodes, such as, for example, dummy structures.

When forming NAND strings 114, other vertical structures may also be formed that extend through the tiers of control gate electrodes 107-1, 107-2, and 107-3 down to substrate 101. Examples of other vertical structures include through array contacts (TACs) that may be used to make electrical connection with components above and/or below the tiers of gate electrodes. These other vertical structures are not illustrated in FIG. 1 for clarity, but are discussed in more detail with reference to later figures.

For illustrative purposes, similar or same parts in a three-dimensional NAND device are labeled using same element numbers. However, element numbers are merely used to distinguish relevant parts in the Detailed Description and do not indicate any similarity or difference in functionalities, compositions, or locations. The structures 200-1200 illustrated in FIG. 2 to FIG. 12 are each part of a three-dimensional NAND memory device. The structures 1400-2100 illustrated in FIG. 14 to FIG. 21 are each part of another three-dimensional NAND memory device. Other parts of the memory devices are not shown for ease of description. Although using three-dimensional NAND devices as examples, in various applications and designs, the disclosed structures can also be applied in similar or different semiconductor devices to, e.g., reduce the number of metal connections or wiring. The specific application of the disclosed structures should not be limited by the embodiments of the present disclosure. For illustrative purposes, word lines and gate electrodes are used interchangeably to describe the present disclosure.

FIGS. 2-12 illustrate different side views (along the X-axis and along the Y-axis) of various fabrication stages of an example NAND memory device, according to some embodiments. Similarly, FIGS. 14-21 illustrate different side views (along the X-axis and along the Y-axis) of various fabrication stages of another example NAND memory device, according to some embodiments. For each stage of the fabrication, the figure denoted with an 'A' represents the cross-section side view of the current fabrication stage along the X-axis, and the figure denoted with a 'B' represents the cross-section side view of the same fabrication stage along the Y-axis.

Figures 2A, 2B:
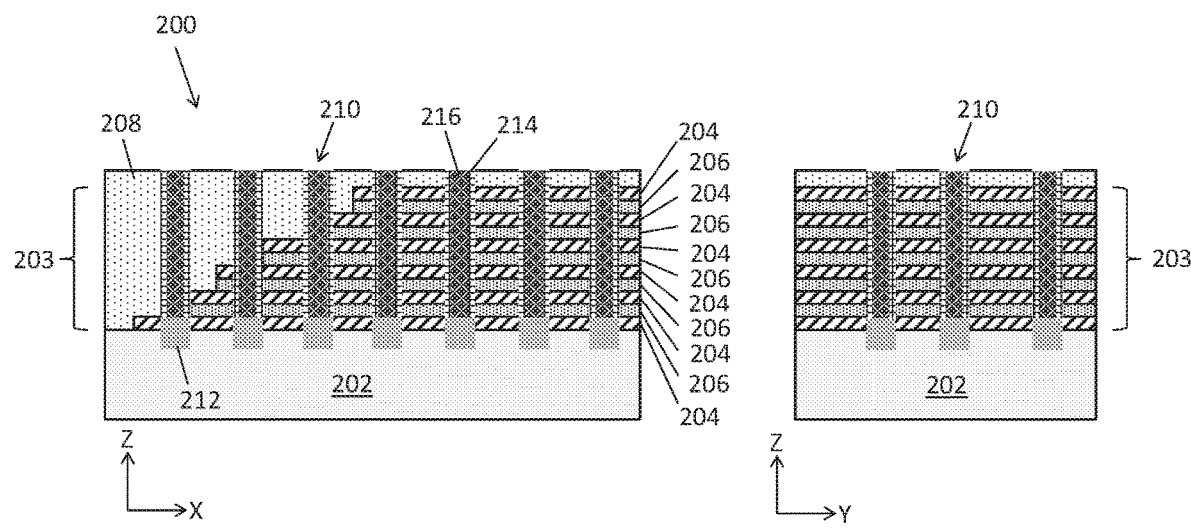
FIGS. 2A and 2B illustrate side views of a three-dimensional memory structure at a stage of an exemplary fabrication process, according to some embodiments.

FIGS. 2A and 2B illustrate an exemplary structure 200 for forming a three-dimensional memory structure, according to some embodiments. In some embodiments, structure 200 includes a substrate 202. Substrate 202 can provide a platform for forming subsequent structures. Such subsequent structures are formed on a front (e.g., top) surface of substrate 202. And such subsequent structures are said to be formed in a vertical direction (e.g., orthogonal to the front surface of substrate 202.) In FIGS. 2A and 2B, and for all subsequent illustrated structures, the X and Y directions are along a plane parallel to the front and back surfaces of substrate 202, while the Z direction is in a direction orthogonal to the front and back surfaces of substrate 202.

In some embodiments, substrate 202 includes any suitable material for forming the three-dimensional memory device. For example, substrate 202 can include silicon, silicon germanium, silicon carbide, silicon on insulator (SOI), germanium on insulator (GOT), glass, gallium nitride, gallium arsenide, and/or other suitable compound.

In some embodiments, an alternating sacrificial/dielectric layer stack 203 is formed over substrate 202. The layer stack 203 includes dielectric layers 204 alternating with sacrificial layers 206. The formation of layer stack 203 can involve depositing sacrificial layers 206 to each have the same thickness or to have different thicknesses. Example thicknesses of sacrificial layers 206 can range from 20 nm to 500 nm. Similarly, dielectric layers 204 can each have the same thickness or have different thicknesses. Example thicknesses of dielectric layers 204 can range from 20 nm to 500 nm. Another dielectric material 208 is deposited over layer stack 203. Dielectric material 208 has the same material composition of dielectric layers 204, according to some embodiments.

The dielectric material of sacrificial layers 206 is different from the dielectric material of dielectric layers 204, according to an embodiment. For example, each of sacrificial layers 206 can be silicon nitride while each of dielectric layers 204 can be silicon dioxide. Other example materials for each of sacrificial layers 206 include poly-crystalline silicon, poly-crystalline germanium, and poly-crystalline germanium-silicon. The dielectric materials used for any of dielectric layers 204 or sacrificial layers 206 can include silicon oxide, silicon nitride, silicon oxynitride, or any combination thereof. Although only eleven total layers are illustrated in layer stack 203, it should be understood that this is for illustrative purposes only and that any number of dielectric layers may be included in layer stack 203.

Layer stack 203 includes a portion having a staircase structure where each of at least sacrificial layers 206 terminate at a different length in the horizontal 'x' direction. This staircase structure allows for electrical contact to connect each of the word lines of the memory device.

In some embodiments, a plurality of sacrificial vertical structures 210 are formed through layer stack 203 and extending down to an epitaxially grown material 212. Epitaxially grown material 212 can include epitaxially grown silicon, and may extend into a portion of substrate 202.

Plurality of sacrificial vertical structures 210 can include a sacrificial liner 214 and a core material 216. Sacrificial liner 214 can be polysilicon, titanium nitride, or made up of a plurality of layers, such as silicon oxide/silicon nitride/silicon oxide (ONO). Core material 216 can be a metal, such as tungsten. A diameter of sacrificial vertical structures 210 can be between about 100 nm and 200 nm.

In some embodiments, the formation of plurality of sacrificial vertical structures 210 includes etching a plurality of openings through layer stack 203 and into a portion of substrate 202. Epitaxially grown material 212 is then formed at the bottom of the plurality of openings, followed by deposition of sacrificial liner 214 and deposition of core material 216. A chemical mechanical polishing process (CMP) may also be performed to planarize a top surface of structure 200 following the formation of plurality of sacrificial vertical structures 210.

FIGS. 3A and 3B illustrate an exemplary structure 300 for forming the three-dimensional memory device, according to some embodiments. A dielectric layer 302 is formed over layer stack 203, and a masking layer 304 is formed on dielectric layer 302, according to some embodiments. Dielectric layer 302 can be oxide, or may have the same material composition as dielectric layers 204. Dielectric layer 302 may also be referred to herein as a capping dielectric layer as the layer "caps" layer stack 203 formed beneath it. Masking layer 304 can be polysilicon, nitride, or any other material having a sufficiently large etch selectivity compared with dielectric layer 302. Each of dielectric layer 302 and masking layer 304 can be formed using any suitable deposition technique, such as sputtering, evaporation, or chemical vapor deposition (CVD). Example CVD techniques include plasma-enhanced CVD (PECVD), low pressure CVD (LPCVD), and atomic layer deposition (ALD).

Figure 4A:
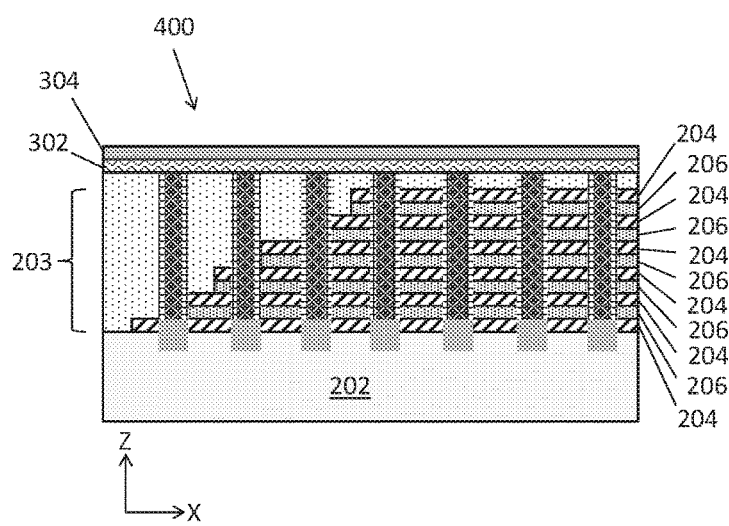
FIGS. 4A and 4B illustrate side views of a three-dimensional memory structure at a stage of an exemplary fabrication process, according to some embodiments.
Figure 4B:
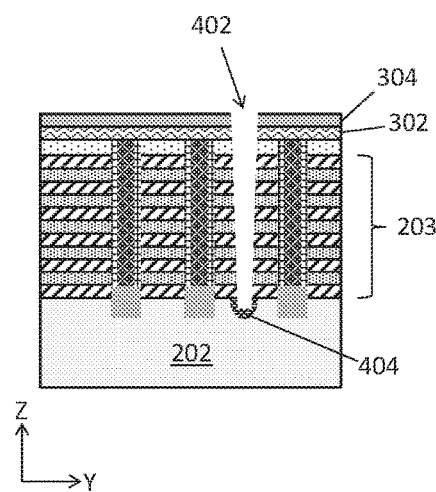

FIGS. 4A and 4B illustrate an exemplary structure 400 for forming the three-dimensional memory device, according to some embodiments. A opening 402 is formed through dielectric layer 302 and layer stack 203, according to some embodiments. Although only one opening 402 is illustrated, it should be understood that a plurality of such openings may be formed across structure 400. In some examples, opening 402 represents a trench etched through layer stack 203 and extending along the X-direction. Opening 402 exposes a portion of substrate 202, and can extend into substrate 202, according to some embodiments. Opening 402 can be formed using any suitable dry etching technique, including deep reactive ion etching (DRIE) or inductively coupled plasma (ICP) etching, to name a few examples.

According to some embodiments, the exposed portion of substrate 202 around the bottom of opening 402 is doped to form a doped region 404. Doped region 404 can be formed using ion implantation or diffusion of dopants into substrate 202. The dopants can include any p-type dopants (e.g., boron) or any n-type dopants (e.g., phosphorus.)

Figure 5A:
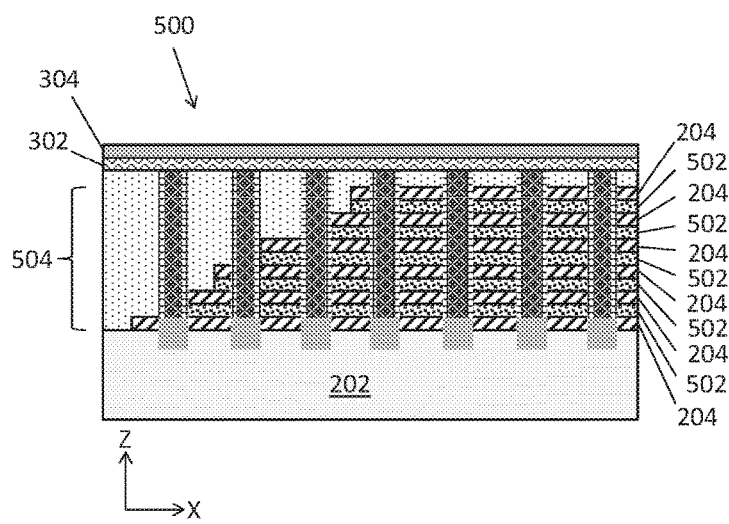
FIGS. 5A and 5B illustrate side views of a three-dimensional memory structure at a stage of an exemplary fabrication process, according to some embodiments.
Figure 5B:
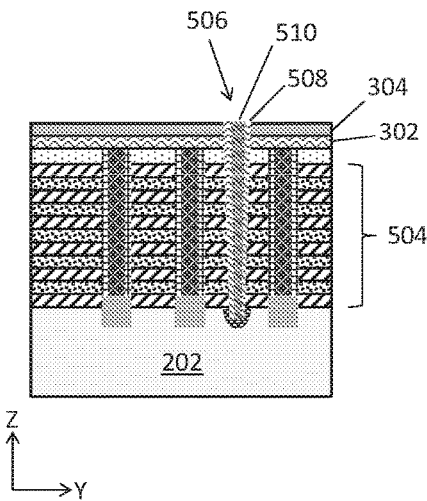

FIGS. 5A and 5B illustrate structure 500 for forming the three-dimensional memory device, according to some embodiments. According to some embodiments, sacrificial layers 206 of layer stack 203 are removed and replaced with conductor layers 502 to form an alternating insulator/conductor stack 504. Sacrificial layers 206 can be removed by a suitable etching process, e.g., an isotropic dry etch or a wet etch. The etching process can have sufficiently high etching selectivity of the material of sacrificial layers 206 over the materials of other parts of structure 500, such that the etching process can have minimal impact on the other parts of structure 500. In some embodiments, sacrificial layers 206 include silicon nitride and the etchant of the isotropic dry etch includes one or more of $CF_4$, $CHF_3$, $C4F_8$, $C4F_6$, and $CH_2F_2$. The radio frequency (RF) power of the isotropic dry etch can be lower than about 100 W and the bias can be lower than about 10 V. In some embodiments, sacrificial layers 206 include silicon nitride and the etchant of the wet etch includes phosphoric acid. In some embodiments, dielectric layers 204 can be removed such that empty space (vacuum) exists between conductor layers 502, The vacuum space between conductor layers 502 acts as an insulating layer and may help reduce parasitic capacitance.

Conductor layers 502 can include conductor materials including, but not limited to, W, Co, Cu, Al, doped silicon, silicides, or any combination thereof. Each of conductor layers 502 can be deposited into the regions left behind by the removal of sacrificial layers 206 using a suitable deposition method such as CVD, sputtering, MOCVD, and/or ALD.

According to some embodiments, after replacing sacrificial layers 206 with conductor layers 502, a first conductive contact 506 is formed within opening 402. First conductive contact 506 can include a blocking layer 508 and a core conductor 510. Blocking layer 508 can include oxide, or any other electrically insulating material. Core conductor 510 can include a metal, such as tungsten, or any other conductive material such as Co, Cu, Al, doped silicon, silicides, or any combination thereof, to name a few examples. Blocking layer 508 can be formed using any suitable deposition technique, such as sputtering, evaporation, or chemical vapor deposition (CVD). Core conductor 510 can be formed using any suitable electroplating or electroless plating techniques. A CMP process may be performed after formation of core conductor 510 to planarize a top surface of structure 500.

Figures 6A, 6B:
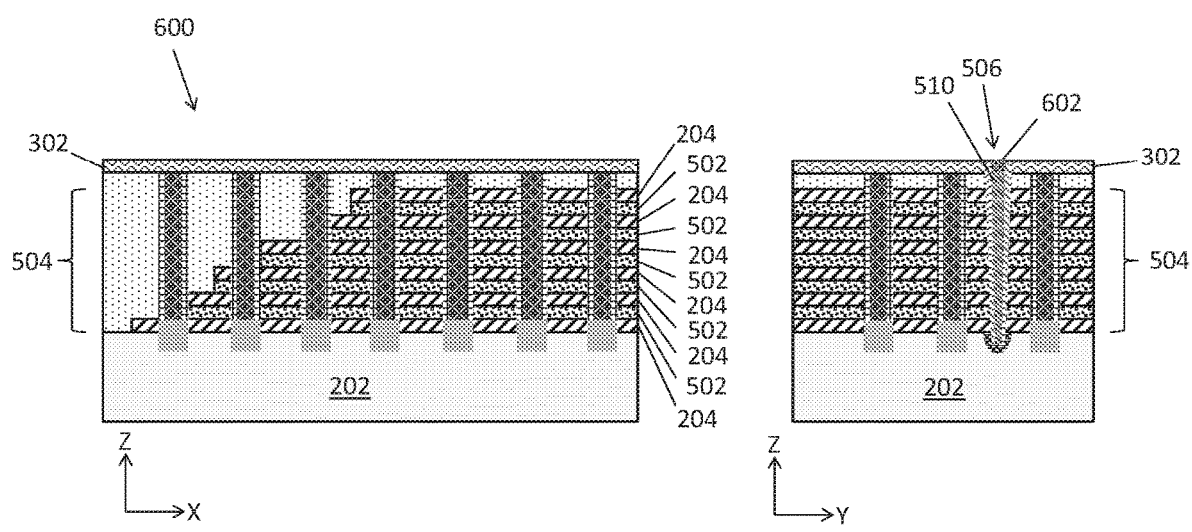
FIGS. 6A and 6B illustrate side views of a three-dimensional memory structure at a stage of an exemplary fabrication process, according to some embodiments.

FIGS. 6A and 6B illustrate structure 600 for forming the three-dimensional memory device, according to some embodiments. Masking layer 304 is removed along with a top portion of first conductive contact 506 using, for example, a CMP process. A remaining portion of core conductor 510 at the top of first conductive contact 506 can then be removed using an etching process, and filled with a conductive material 602. The etching process may be any suitable wet or dry etching process. Conductive material 602 can be polysilicon, and its presence can reduce stress in structure 600 caused by core conductor 510.

FIGS. 7A and 7B illustrate structure 700 for forming the three-dimensional memory device, according to some embodiments. A second alternating sacrificial/dielectric layer stack 702 is formed over dielectric layer 302, according to some embodiments. Layer stack 702 includes dielectric layers 704 alternating with sacrificial layers 706. The formation of layer stack 702 can involve depositing sacrificial layers 706 to each have the same thickness or to have different thicknesses. Example thicknesses of sacrificial layers 706 can range from 20 nm to 500 nm. Similarly, dielectric layers 704 can each have the same thickness or have different thicknesses. Example thicknesses of dielectric layers 704 can range from 20 nm to 500 nm. Another dielectric material 708 is deposited over layer stack 702. Dielectric material 708 has the same material composition of dielectric layers 704, according to some embodiments.

The dielectric material of sacrificial layers 706 is different from the dielectric material of dielectric layers 704, according to an embodiment. For example, each of sacrificial layers 706 can be silicon nitride while each of dielectric layers 704 can be silicon dioxide. Other example materials for each of sacrificial layers 706 include poly-crystalline silicon, poly-crystalline germanium, and poly-crystalline germanium-silicon. The dielectric materials used for any of dielectric layers 704 or sacrificial layers 706 can include silicon oxide, silicon nitride, silicon oxynitride, or any combination thereof. Although only eleven total layers are illustrated in layer stack 702, it should be understood that this is for illustrative purposes only and that any number of dielectric layers may be included in layer stack 702. Dielectric layers 704 can have the same material composition as dielectric layers 204 from layer stack 203. Sacrificial layers 706 can have the same material composition as sacrificial layers 206 from layer stack 203.

Layer stack 702 includes a portion having a staircase structure where each of at least sacrificial layers 706 terminate at a different length in the horizontal 'x' direction. This staircase structure allows for electrical contact to connect each of the word lines of the memory device. An additional top dielectric layer 710 can also be deposited over layer stack 702. Top dielectric layer 710 can be oxide, to name one example.

FIGS. 8A and 8B illustrate structure 800 for forming the three-dimensional memory device, according to some embodiments, A plurality of openings 802 are formed through layer stack 702 and top dielectric layer 710 using, for example, a DRIE or ICP process. According to some embodiments, plurality of openings 802 are substantially aligned with vertical sacrificial structures 210, and extend through dielectric layer 302 to expose a top surface of vertical sacrificial structures 210. Plurality of openings 802 can have substantially the same diameter or cross-sectional shape as vertical sacrificial structures 210. It should be understood that plurality of openings 802 are illustrated as having vertical sidewalk for ease of illustration only, and that plurality of openings 802 can instead have sloped or tapered sidewalls.

According to some embodiments, a protection layer 804 is deposited over the sidewalls of plurality of openings 802 through layer stack 702 and top dielectric layer 710. Protection layer 804 can be polysilicon and is provided to protect the layers of layer stack 702 during subsequent processing operations.

Figure 9A:
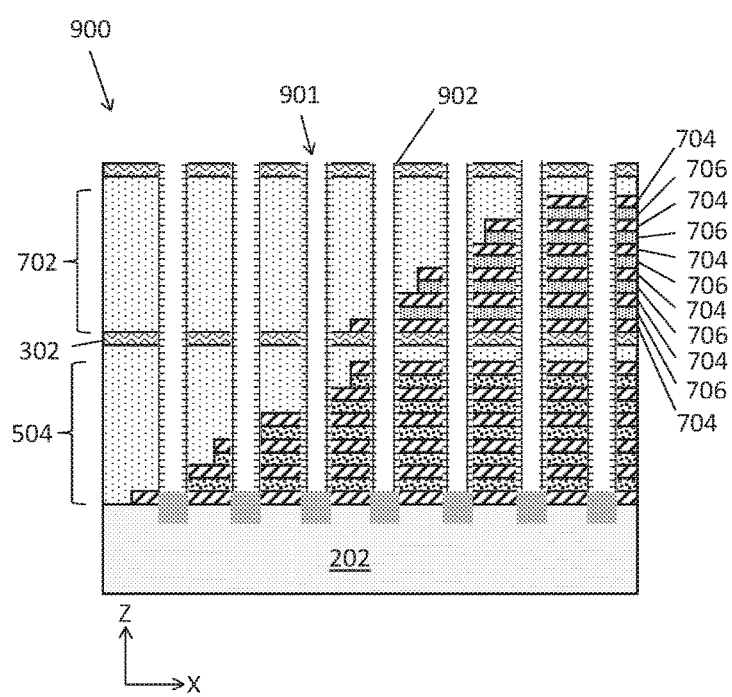
FIGS. 9A and 9B illustrate side views of a three-dimensional memory structure at a stage of an exemplary fabrication process, according to some embodiments.
Figure 9B:
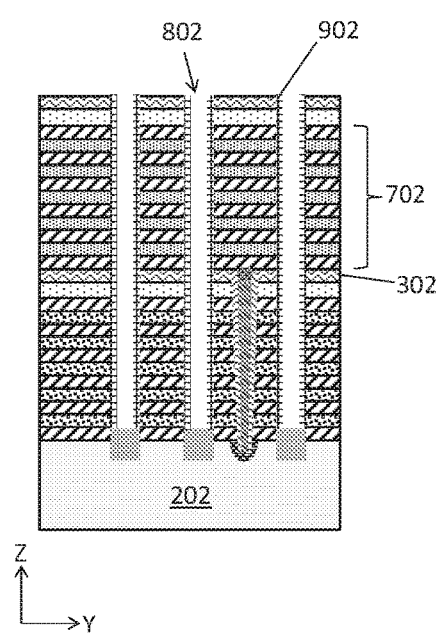

FIGS. 9A and 9B illustrate structure 900 for forming the three-dimensional memory device, according to some embodiments, Vertical sacrificial structures 210 are removed, followed by the removal of protection layer 804, leaving tall openings 901 that extend through both layer stack 702 and layer stack 504. Vertical sacrificial structures 210 can be removed using wet chemicals such as, for example, piranha solution (mixture of sulfuric acid and hydrogen peroxide). After removal of vertical sacrificial structures 210 and protection layer 804, a plurality of memory layers 902 can be deposited over the sidewalls of tall openings 901. Plurality of memory layers 902 can include a semiconductor channel layer, such as amorphous silicon, polysilicon, or single crystalline silicon. Plurality of memory layers 902 can also include a tunneling layer, a storage layer (also known as "charge trap/storage layer"), and a blocking layer. The blocking layer, the storage layer, the tunneling layer, and the semiconductor channel layer are arranged over one another on the sidewalk of tall openings 901 in the order listed (with the blocking layer deposited first and the semiconductor channel layer deposited last), according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, plurality of memory layers 902 includes silicon oxide/silicon nitride/silicon oxide (ONO) dielectrics (e.g., a tunneling layer including silicon oxide, a storage layer including silicon nitride, and a blocking layer including silicon oxide).

It should be understood that tall openings 901 are illustrated as having vertical sidewalls for ease of illustration only, and that tall openings 901 can instead have sloped or tapered sidewalls.

Figure 10A:
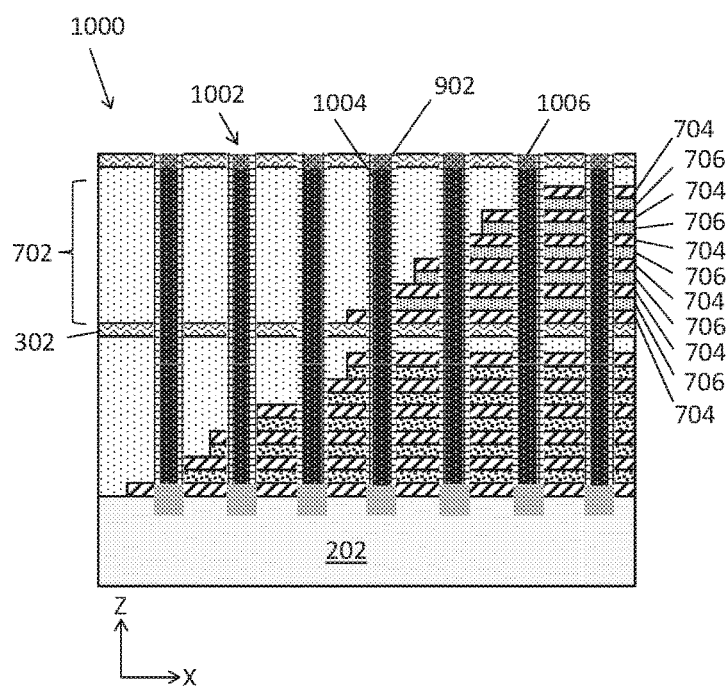
FIGS. 10A and 10B illustrate side views of a three-dimensional memory structure at a stage of an exemplary fabrication process, according to some embodiments.
Figure 10B:
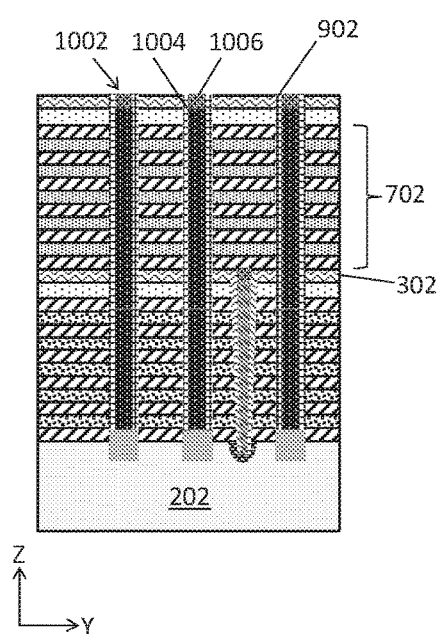

FIGS. 10A and 10B illustrate structure 1000 for forming the three-dimensional memory device, according to some embodiments. The remaining portion of tall openings 901 is filled with an insulating material 1004 to complete the formation of vertical NAND strings 1002, according to some embodiments. Insulating material 1004 can be any dielectric material, such as oxide, for example. A top portion of insulating material 1004 can re recessed using any suitable etching process and filled with a conductive material 1006. In some examples, conductive material 1006 includes polysilicon.

Figures 11A, 11B:
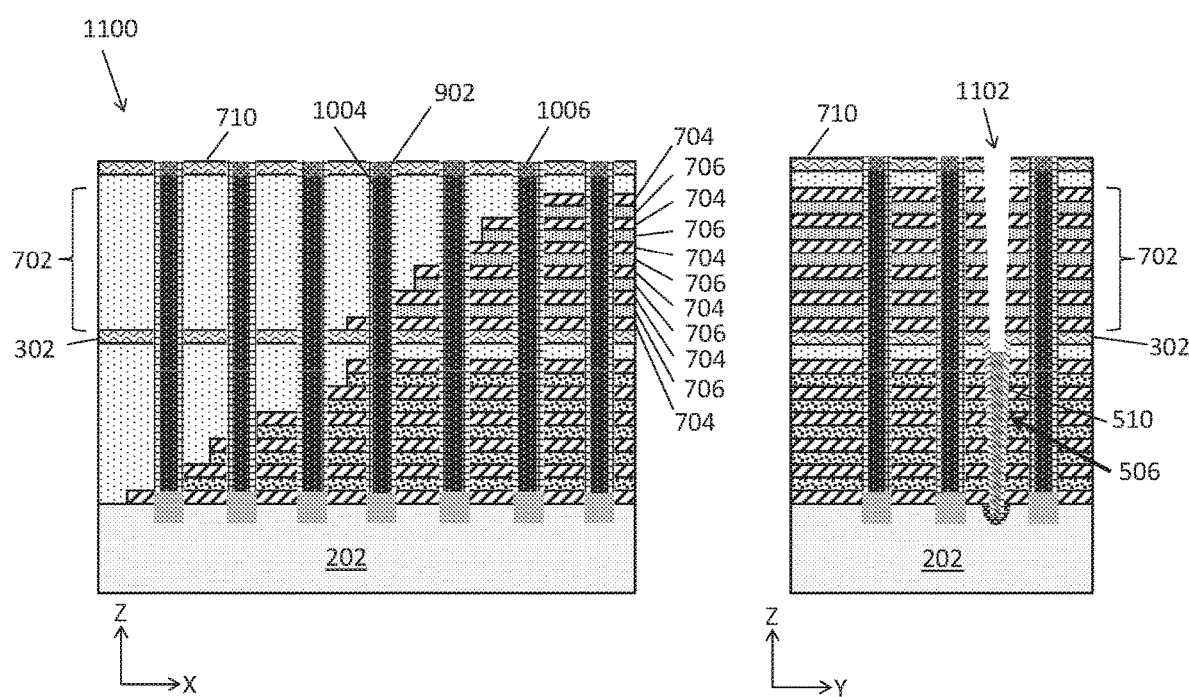
FIGS. 11A and 11B illustrate side views of a three-dimensional memory structure at a stage of an exemplary fabrication process, according to some embodiments.

FIGS. 11A and 11B illustrate structure 1100 for forming the three-dimensional memory device, according to some embodiments. A opening 1102 is formed through top dielectric layer 710 and layer stack 702, according to some embodiments. Although only one opening 1102 is illustrated; it should be understood that a plurality of such openings may be formed across structure 1100. In some examples, opening 1102 represents a trench etched through layer stack 702 and extending along the X-direction. Opening 402 can be formed using any suitable dry etching technique, including deep reactive ion etching (DRIB) or inductively coupled plasma (ICP) etching, to name a few examples.

Opening 1102 can be substantially aligned over first conductive contact 506, such that opening 1102 extends into a portion of first conductive contact 506. For example, opening 1102 can extend through conductive material 602 or the formation of opening 1102 can result in the complete removal of conductive material 602. In some embodiments, conductive material 602 remains around the lower end of opening 1102.

Figures 12A, 12B:
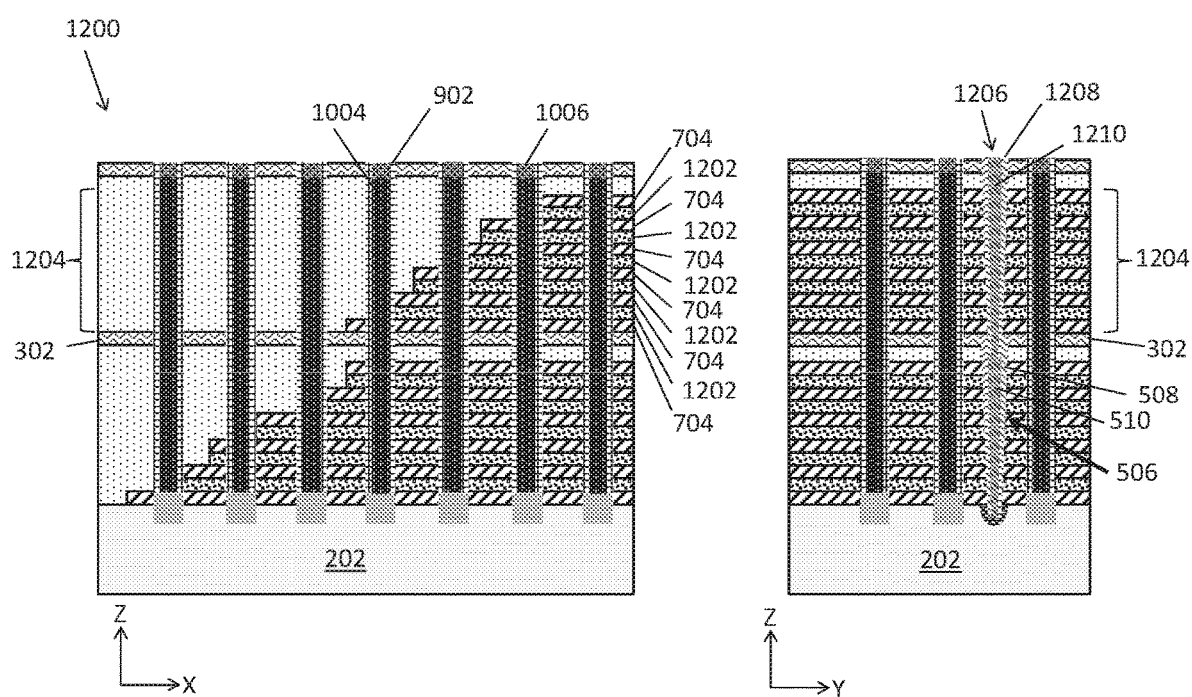
FIGS. 12A and 12B illustrate side views of a three-dimensional memory structure at a stage of an exemplary fabrication process, according to some embodiments.

FIGS. 12A and 12B illustrate structure 1200 for forming the three-dimensional memory device, according to some embodiments. According to some embodiments, sacrificial layers 706 of layer stack 702 are removed and replaced with conductor layers 1202 to form an alternating insulator/conductor stack 1204. Sacrificial layers 706 can be removed by a suitable etching process, e.g., an isotropic dry etch or a wet etch. The etching process can have sufficiently high etching selectivity of the material of sacrificial layers 706 over the materials of other parts of structure 1200, such that the etching process can have minimal impact on the other parts of structure 1200. In some embodiments, sacrificial layers 706 include silicon nitride and the etchant of the isotropic dry etch includes one or more of $CF_4$, $CHF_3$, $C_4F_8$, $C_4F_6$, and $CH_2F_2$. The radio frequency (RF) power of the isotropic dry etch can be lower than about 100 W and the bias can be lower than about 10 V. In some embodiments, sacrificial layers 706 include silicon nitride and the etchant of the wet etch includes phosphoric acid. In some embodiments, dielectric layers 704 can be removed such that empty space (vacuum) exists between conductor layers 1202. The vacuum space between conductor layers 1202 acts as an insulating layer and may help reduce parasitic capacitance.

Conductor layers 1202 can include conductor materials including, but not limited to, W, Co, Cu, Al, doped silicon, silicides, or any combination thereof. Each of conductor layers 1202 can be deposited into the regions left behind by the removal of sacrificial layers 706 using a suitable deposition method such as CVD, sputtering, MOCVD, and/or ALD.

According to some embodiments, after replacing sacrificial layers 706 with conductor layers 1202, a second conductive contact 1206 is formed within opening 1102. Second conductive contact 1206 can include a blocking layer 1208 and a core conductor 1210. Blocking layer 1208 can include oxide, or any other electrically insulating material. Core conductor 1210 can include a metal, such as tungsten, or any other conductive material such as Co, Cu, Al, doped silicon, silicides, or any combination thereof, to name a few examples. Blocking layer 1208 can be formed using any suitable deposition technique, such as sputtering, evaporation, or chemical vapor deposition (CVD). Core conductor 1210 can be formed using any suitable electroplating or electroless plating techniques. A CMP process may be performed after formation of core conductor 1210 to planarize a top surface of structure 1200. In some embodiments, blocking layer 1210 has the same material composition as blocking layer 508 of first conductive contact 506, and core conductor 1210 has the same material composition as core conductor 510 of first conductive contact 506. Second conductive contact 1206 can make an ohmic contact with first conductive contact 506, such that first conductive contact 506 and second conductive contact 1206 combine to form a stacked array common source (ACS) for the memory device.

In some embodiments, a bottom end of second conductive contact 1206 may extend through conductive material 602 (not shown), such that conductive material 602 surrounds the bottom end of second conductive contact 1206.

Figure 13:
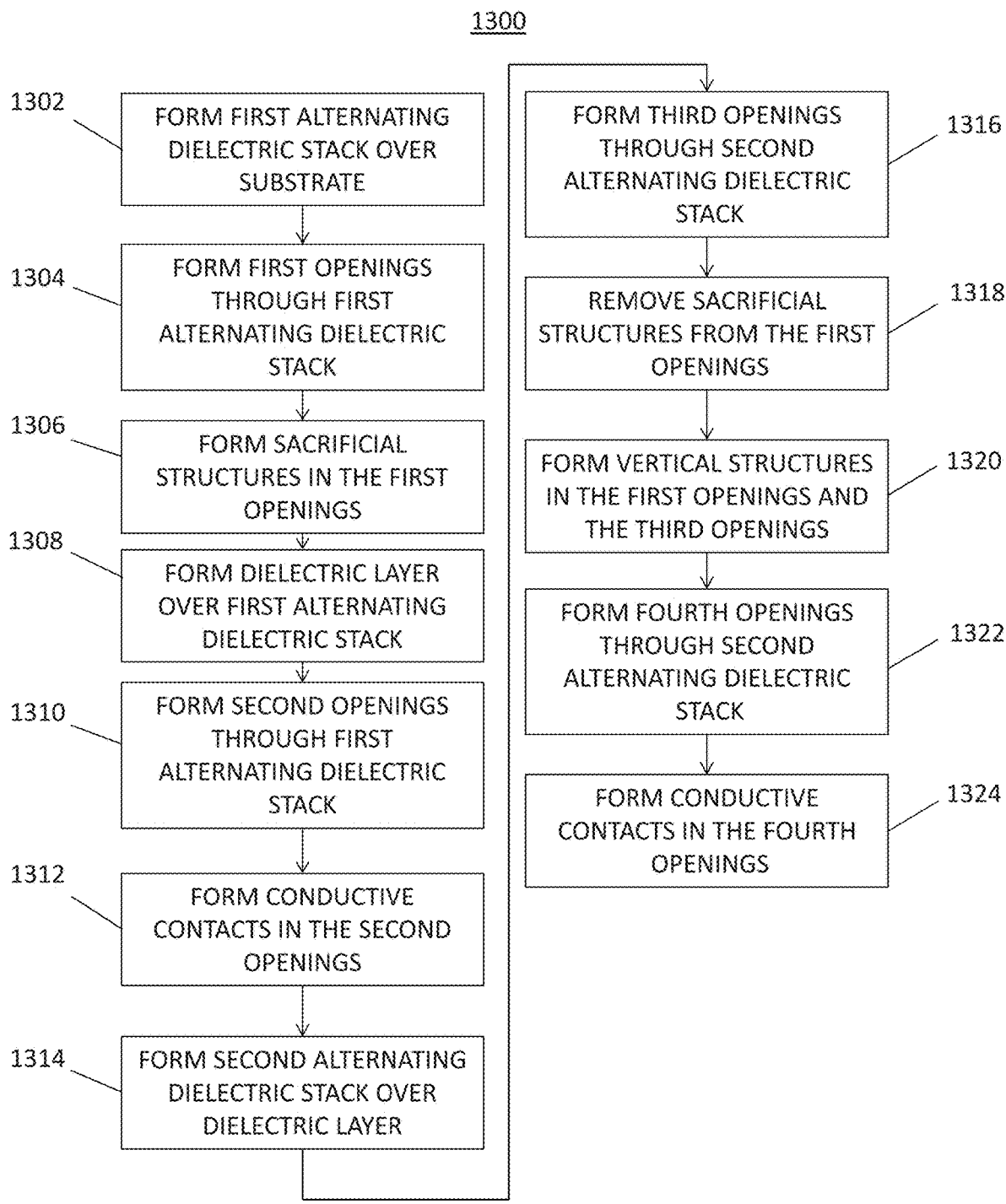
FIG. 13 is an illustration of a fabrication process for forming a three-dimensional memory structure, according to some embodiments.

FIG. 13 is a flowchart of an exemplary method 1300 for forming a NAND memory device, according to some embodiments. The operations of method 1300 are generally illustrated in FIGS. 2-12. It should be understood that the operations shown in method 1300 are not exhaustive and that other operations can be performed as well before, after, or between any of the illustrated operations. In various embodiments of the present disclosure, the operations of method 1300 can be performed in a different order and/or vary. It should be noted that the first three operations of method 1300 (operations 1302-1306) are illustrated together in FIGS. 2A and 2B.

In operation 1302, a first alternating dielectric stack is formed over a substrate. The first alternating dielectric stack may include sacrificial dielectric layers alternating with dielectric layers having a different material composition. The layers of the first alternating dielectric stack can include materials including, but not limited to, silicon oxide, silicon nitride, silicon oxynitride, or any combination thereof. The layers of the first alternating dielectric stack can include dielectric materials deposited by one or more thin film deposition processes including, but not limited to, CVD, PVD, ALD, or any combination thereof.

According to some embodiments, the layers of the first alternating dielectric stack have a staircase structure where each of at least the sacrificial layers terminate at a different length in a horizontal direction over the surface of the substrate. This staircase structure allows for electrical contact to connect each of the word lines of the memory device.

In operation 1304, one or more first openings are etched through the alternating dielectric stack, thus exposing a surface of the substrate. Each of the one or more first openings may be etched through the alternating dielectric stack using an RIE process. In some embodiments, a material is epitaxially grown at the bottom of the one or more first openings on the exposed substrate. The epitaxially grown material may be epitaxially, grown silicon.

In operation 1306, one or more vertical sacrificial structures are formed within the one or more first openings. Forming the one or more sacrificial vertical structures may include first forming a sacrificial liner following by forming a core material to fill a remainder of the one or more first openings. The sacrificial liner may be polysilicon or titanium nitride. The core material may be a metal, such as tungsten. The sacrificial liner may be deposited using any suitable thin film deposition technique, such as CVD, PVD, ALD, or any combination thereof. The core material may be deposited using electroplating or electroless plating techniques.

In operation 1308, a dielectric layer is formed over the first alternating dielectric stack. The dielectric layer may be may be oxide, and may be referred to as a capping dielectric layer. In some embodiments; a masking layer is deposited over the capping dielectric layer, and may be polysilicon, nitride, or any other material having a sufficiently large etch selectivity compared with the dielectric layer. Each of the capping dielectric layer and the masking layer may be formed using any suitable thin film deposition technique, such as sputtering, evaporation, or chemical vapor deposition (CVD). Example CVD techniques include plasma-enhanced CVD (PECVD); low pressure CND (LPCVD), and atomic layer deposition (ALD).

In operation 1310, one or more second openings are formed through the first alternating dielectric stack and through the capping dielectric layer. The one or more second openings may be a trench etched through the first alternating dielectric stack. The one or more second openings exposes a portion of the substrate and may extend into the substrate, according to some embodiments. The one or more second openings may be formed using any suitable dry etching technique, including deep reactive ion etching (DRIE) or inductively coupled plasma (ICP) etching, to name a few examples.

According to some embodiments, the exposed portion of the substrate around the bottom of the one or more second openings is doped to form a doped region within the substrate. The doped region may be formed using ion implantation or diffusion of dopants into the substrate. The dopants may include any p-type dopants (e.g., boron) or any n-type dopants (e.g., phosphorus.)

According to some embodiments, the sacrificial layers of the alternating first dielectric stack may be removed and replaced by conductor layers to form a first alternating conductor/insulator stack during, or directly after, operation 1310.

In operation 1312, one or more first conductive contacts are formed within the one or more second openings. Forming the one or more first conductive contacts may include forming a blocking layer followed by forming a core conductor that fills the remainder of the one or more second openings. The blocking layer may include oxide, or any other electrically insulating material. The core conductor may include a metal, such as tungsten, or any other conductive material such as Co, Cu, Al, doped silicon, silicides, or any combination thereof, to name a few examples. The blocking layer may be formed using any suitable deposition technique, such as sputtering, evaporation, or chemical vapor deposition (CVD). The core conductor may be formed using any suitable electroplating or electroless plating techniques. A CMP process may be performed after formation of the core conductor to planarize a top surface of the structure.

In some embodiments, operation 1312 also includes recessing a top portion of the core conductor and filling the recessed portion with a different conductive material. The different conductive material may be polysilicon, for example.

In operation 1314, a second alternating dielectric stack is formed over the capping dielectric layer. The second alternating dielectric stack may include sacrificial dielectric layers alternating with dielectric layers having a different material composition. The layers of the second alternating dielectric stack can include materials including, but not limited to, silicon oxide, silicon nitride, silicon oxynitride, or any combination thereof. The layers of the second alternating dielectric stack can include dielectric materials deposited by one or more thin film deposition processes including, but not limited to, CVD, PVD, ALD, or any combination thereof.

According to some embodiments, the layers of the second alternating dielectric stack have a staircase structure where each of at least the sacrificial layers terminate at a different length in a horizontal direction over the surface of the substrate. This staircase structure allows for electrical contact to connect each of the word lines of the memory device.

In operation 1316, one or more third openings are etched through the second alternating dielectric stack. The one or more third openings may be substantially aligned with the vertical sacrificial structures formed in the one or more first openings. The one or more third openings may extend through the dielectric layer to expose a top surface of the vertical sacrificial structures. The one or more third openings may be formed to have substantially the same diameter or cross-sectional shape as the vertical sacrificial structures. In some embodiments, operation 1316 also includes forming a sacrificial layer of polysilicon within the one or more third openings. The sacrificial layer of polysilicon covers the sidewalls of the one or more third opening and may be used to protect the second alternating dielectric stack during subsequent operations.

In operation 1318, the vertical sacrificial structures are removed from the one or more first openings leaving one or more tall openings that extend through both the second alternating dielectric stack and the first alternating conductor/dielectric stack. The vertical sacrificial structures may be removed using wet chemicals such as, for example, piranha solution (mixture of sulfuric acid and hydrogen peroxide).

In operation 1320, one or more vertical structures are formed within the one or more tall openings. According to some embodiments, forming the one or more vertical structures includes first forming a plurality of memory layers over the sidewalls of the one or more tall openings. Forming the plurality of memory layers may include depositing a semiconductor channel layer, such as amorphous silicon, polysilicon, or single crystalline silicon, a tunneling layer, a storage layer (also known as "charge trap/storage layer"), and a blocking layer. The blocking layer, the storage layer, the tunneling layer, and the semiconductor channel layer may each be deposited in the order listed on the sidewalls of the one or more tall openings, according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, the plurality of memory layers includes silicon oxide/silicon nitride/silicon oxide (ONO) dielectrics (e.g., a tunneling layer including silicon oxide, a storage layer including silicon nitride, and a blocking layer including silicon oxide).

After formation of the plurality of memory layers, a remainder of the one or more tall openings may be filled with an insulating material. The insulating material may be any dielectric material, such as oxide, for example. In some embodiments, operation 1320 also includes recessing a top portion of the insulating material using any suitable etching process and filling the recessed area with a conductive material. In some examples, the conductive material includes polysilicon. The one or more vertical structures may be NAND memory strings.

In operation 1322, one or more fourth openings are formed through the second alternating dielectric stack. The one or more fourth openings may be a trench etched through the second alternating dielectric stack. The one or more fourth openings may be substantially aligned over the one or more first conductive contacts formed within the one or more second openings. The one or more fourth openings exposes a portion of the one or more first conductive contacts, according to some embodiments. The one or more fourth openings may be formed using any suitable dry etching technique, including deep reactive ion etching (DRIE) or inductively coupled plasma (ICP) etching, to name a few examples. In some embodiments, the one or more fourth openings extend far enough to expose the core conductor of the one or more first conductive contacts.

According to some embodiments, the sacrificial layers of the second alternating dielectric stack may be removed and replaced by conductor layers to form a second alternating conductor/insulator stack during, or directly after, operation 1322.

In operation 1324, one or more second conductive contacts are formed within the one or more fourth openings. Forming the one or more second conductive contacts may include forming a blocking layer followed by forming a core conductor that fills the remainder of the one or more fourth openings. The blocking layer may include oxide, or any other electrically insulating material. The core conductor may include a metal, such as tungsten, or any other conductive material such as Co, Cu, Al, doped silicon, silicides, or any combination thereof, to name a few examples. The blocking layer may be formed using any suitable deposition technique, such as sputtering, evaporation, or chemical vapor deposition (CVD). The core conductor may be formed using any suitable electroplating or electroless plating techniques. A CMP process may be performed after formation of the core conductor to planarize a top surface of the structure. Forming the one or more second conductive contacts may include forming an omhic contact between the one or more first conductive contacts and the one or more second conductive contacts. The formation of the one or more second conductive contacts stacked on the one or more first conductive contacts forms an ACS for the memory device, according to some embodiments.

Figure 14A:
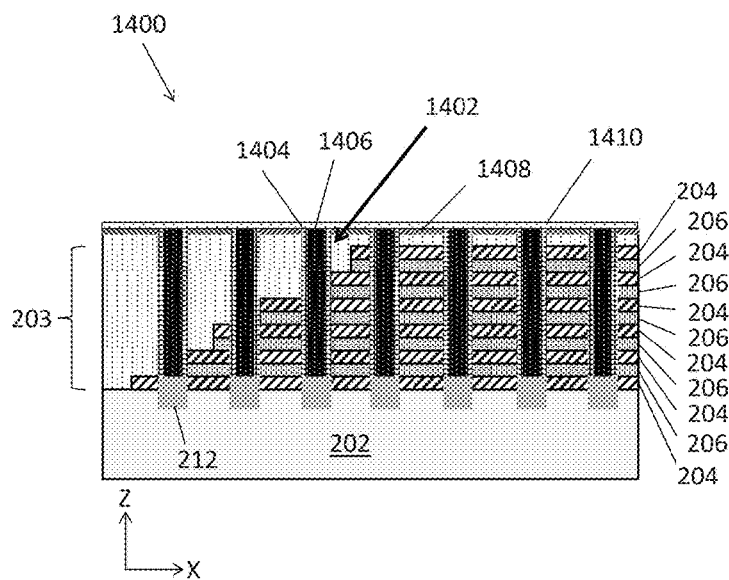
FIGS. 14A and 14B illustrate side views of another three-dimensional memory structure at a stage of an exemplary fabrication process, according to some embodiments.
Figure 14B:
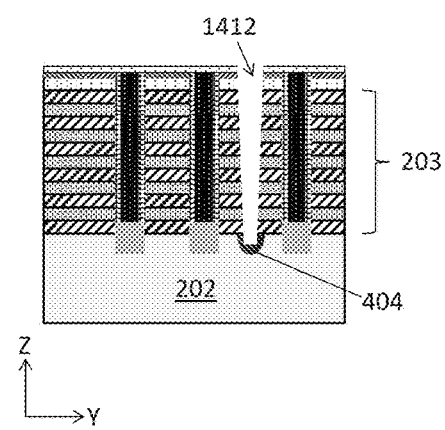

FIGS. 14A and 14B illustrate an exemplary structure 1400 for forming another three-dimensional memory structure, according to some embodiments. The formation of sacrificial/dielectric layer stack 203 is performed in the same way as described above with reference to FIG. 2, and as such, further description of its formation is not provided again.

In structure 1400, instead of sacrificial vertical structures 210 being used, a plurality of first NAND strings 1402 extend vertically through sacrificial/dielectric layer stack 203. Each of first NAND strings 1402 includes a plurality of memory layers 1404 and a core insulator 1406. Plurality of memory layers 1404 can include a semiconductor channel layer, such as amorphous silicon, polysilicon, or single crystalline silicon. Plurality of memory layers 1404 can also include a tunneling layer, a storage layer (also known as "charge trap/storage layer"), and a blocking layer. The blocking layer, the storage layer, the tunneling layer, and the semiconductor channel layer are arranged over one another on the sidewalls in the order listed (with the blocking layer deposited first and the semiconductor channel layer deposited last), according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, plurality of memory layers 1404 includes silicon oxide/silicon nitride/silicon oxide (ONO) dielectrics (e.g., a tunneling layer including silicon oxide, a storage layer including silicon nitride, and a blocking layer including silicon oxide). Core insulator 1406 can be any dielectric material, such as oxide, for example.

According to some embodiments, the semiconductor channel layer of plurality of memory layers 1404 is also deposited along the top surface of structure 1400 as top channel layer 1408. A capping dielectric layer 1410 can be deposited over a remainder of structure 1400. Additionally, an opening 1412 is formed through each of capping dielectric layer 1410, top channel layer 1408, and layer stack 203, according to some embodiments. Although only one opening 1412 is illustrated, it should be understood that a plurality of such openings may be formed across structure 1400. In some examples, opening 1412 represents a trench etched through layer stack 203 and extending along the X-direction. Opening 1412 exposes a portion of substrate 202, and can extend into substrate 202, according to some embodiments. Opening 1412 can be formed using any suitable dry etching technique, including deep reactive ion etching (DRIE) or inductively coupled plasma (ICP) etching, to name a few examples. According to some embodiments, the exposed portion of substrate 202 around the bottom of opening 1412 is doped to form a doped region 404. Doped region 404 can be formed using ion implantation or diffusion of dopants into substrate 202. The dopants can include any p-type dopants (e.g., boron) or any n-type dopants (e.g., phosphorus.)

Figures 15A, 15B:
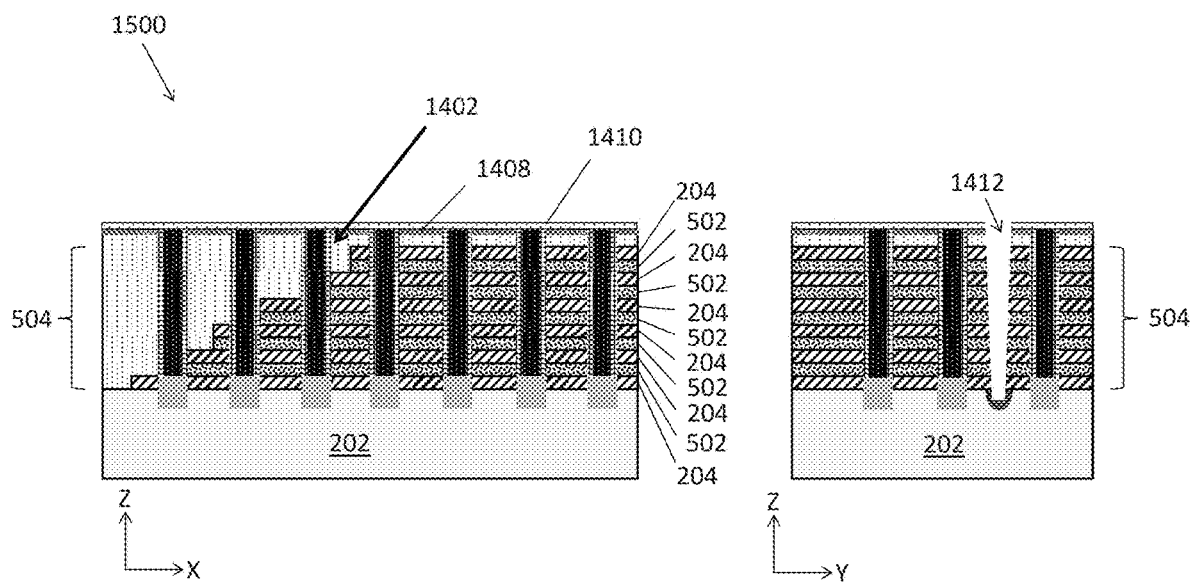
FIGS. 15A and 15B illustrate side views of another three-dimensional memory structure at a stage of an exemplary fabrication process, according to some embodiments.

FIGS. 15A and 15B illustrate an exemplary structure 1500 for forming another three-dimensional memory structure, according to some embodiments. According to some embodiments, sacrificial layers 206 of layer stack 203 are removed and replaced with conductor layers 502 to form an alternating insulator/conductor stack 504, as discussed above with reference to FIG. 5. NAND strings 1402 are protected from the etchants used to remove sacrificial layers 206 by both top channel layer 1408 and capping dielectric layer 1410, according to some embodiments.

Figures 16A, 16B:
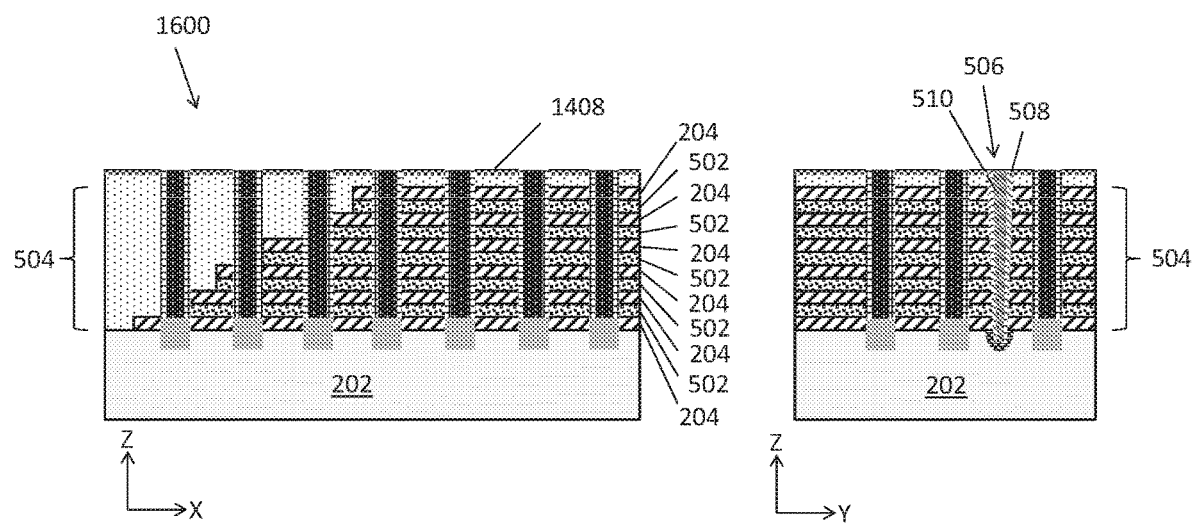
FIGS. 16A and 16B illustrate side views of another three-dimensional memory structure at a stage of an exemplary fabrication process, according to some embodiments.

FIGS. 16A and 16B illustrate an exemplary structure 1600 for forming another three-dimensional memory structure, according to some embodiments. A conductive contact 506 is formed within opening 1412 having a blocking layer 508 and a core conductor 510, just as described above with reference to FIG. 5. A CMP process can be performed afterwards to remove at least capping dielectric layer 1410.

Figures 17A, 17B:
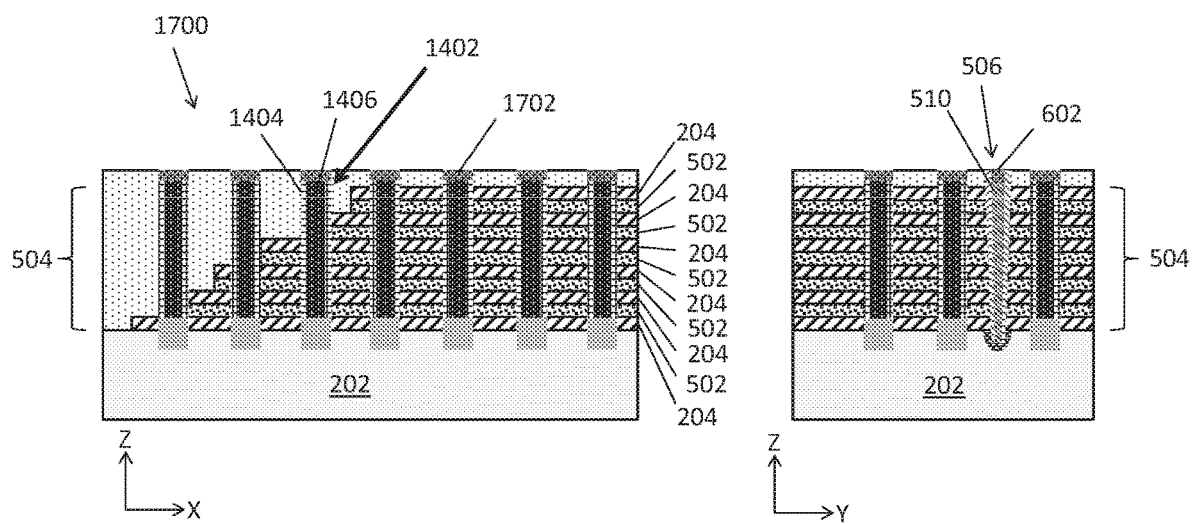
FIGS. 17A and 17B illustrate side views of another three-dimensional memory structure at a stage of an exemplary fabrication process, according to some embodiments.

FIGS. 17A and 17B illustrate an exemplary structure 1700 for forming another three-dimensional memory structure, according to some embodiments. Top channel layer 1408 is removed and a further recess can be formed on a top portion of conductive contact 506, and subsequently filled with a conductive material 602, as explained above with reference to FIG. 6B. In some embodiments, conductive material 602 also surrounds a top portion of core conductor 510 that juts above a bottom of the recess.

According to some embodiments, other recesses are also formed through a top portion of first NAND strings 1402. The formation of these recesses can involve the etching of each of plurality of memory layers 1408 and core insulator material 1410. These other recesses are similarly filled with a conductive material 1702. In some embodiments, conductive material 1702 is polysilicon.

FIGS. 18A and 18B illustrate an exemplary structure 1800 for forming another three-dimensional memory structure, according to some embodiments. A second alternating sacrificial/dielectric layer stack 702 is formed over a top surface of structure 1700, and is capped with top dielectric layer 710. The formation of second alternating sacrificial/dielectric layer stack 702 and top dielectric layer 710 are performed in the same way as described above with reference to FIGS. 7A and 7B, and as such, further description of their formation is not provided again.

FIGS. 19A and 19B illustrate an exemplary structure 1900 for forming another three-dimensional memory structure, according to some embodiments. A plurality of openings 1902 are formed through layer stack 702 and top dielectric layer 710 using, for example, a DRIE or ICP process. According to some embodiments, plurality of openings 1902 are substantially aligned with first NAND strings 1402, and extend through layer stack 702 to expose a top surface of conductive material 1702. Plurality of openings 1902 can also extend into a thickness of conductive material 1702. Plurality of openings 1902 can have substantially the same diameter or cross-sectional shape as first NAND strings 1402. It should be understood that plurality of openings 1902 are illustrated as having vertical sidewalls for ease of illustration only, and that plurality of openings 1902 can instead have sloped or tapered sidewalls.

Figure 20A:
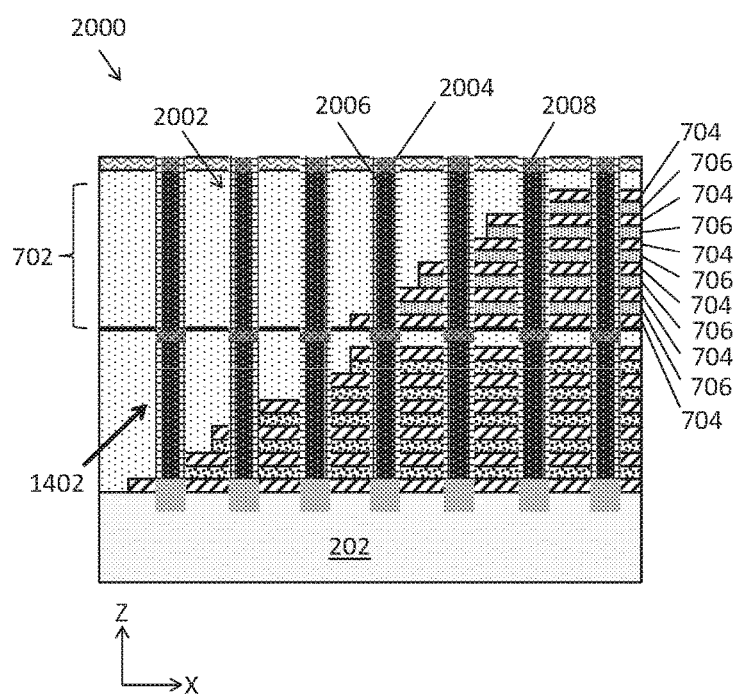
FIGS. 20A and 20B illustrate side views of another three-dimensional memory structure at a stage of an exemplary fabrication process, according to some embodiments.
Figure 20B:
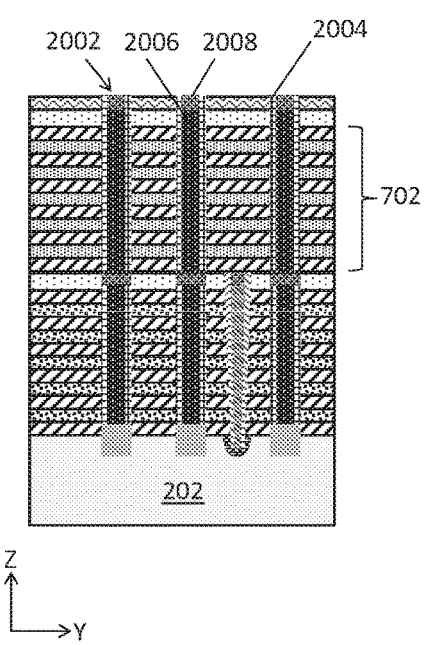

FIGS. 20A and 20B illustrate an exemplary structure 2000 for forming another three-dimensional memory structure, according to some embodiments. A plurality of second NAND strings 2002 are formed in plurality of openings 1902, and each include a plurality of memory layers 2004 surrounding a core insulator 2006. Plurality of memory layers 2004 and core insulator 2006 are formed the same way as described above for the similar first NAND strings 1402. According to some embodiments, the semiconductor layer of second NAND strings 2002 is conductively connected with the semiconductor layer of first NAND strings 1402 via conductive material 1702. A top portion of core insulator 2006 can be recessed using any suitable etching process and filled with a conductive material 2008. In some examples, conductive material 2008 includes polysilicon.

Figures 21A, 21B:
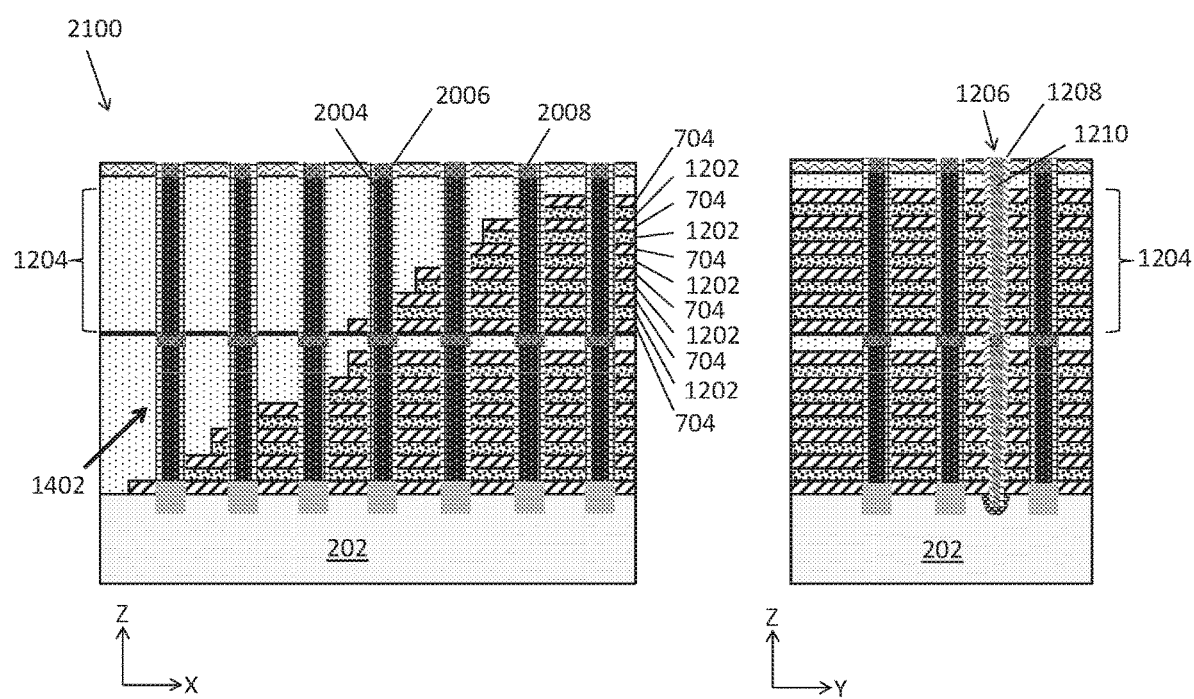
FIGS. 21A and 21B illustrate side views of another three-dimensional memory structure at a stage of an exemplary fabrication process, according to some embodiments.
Figure 22:
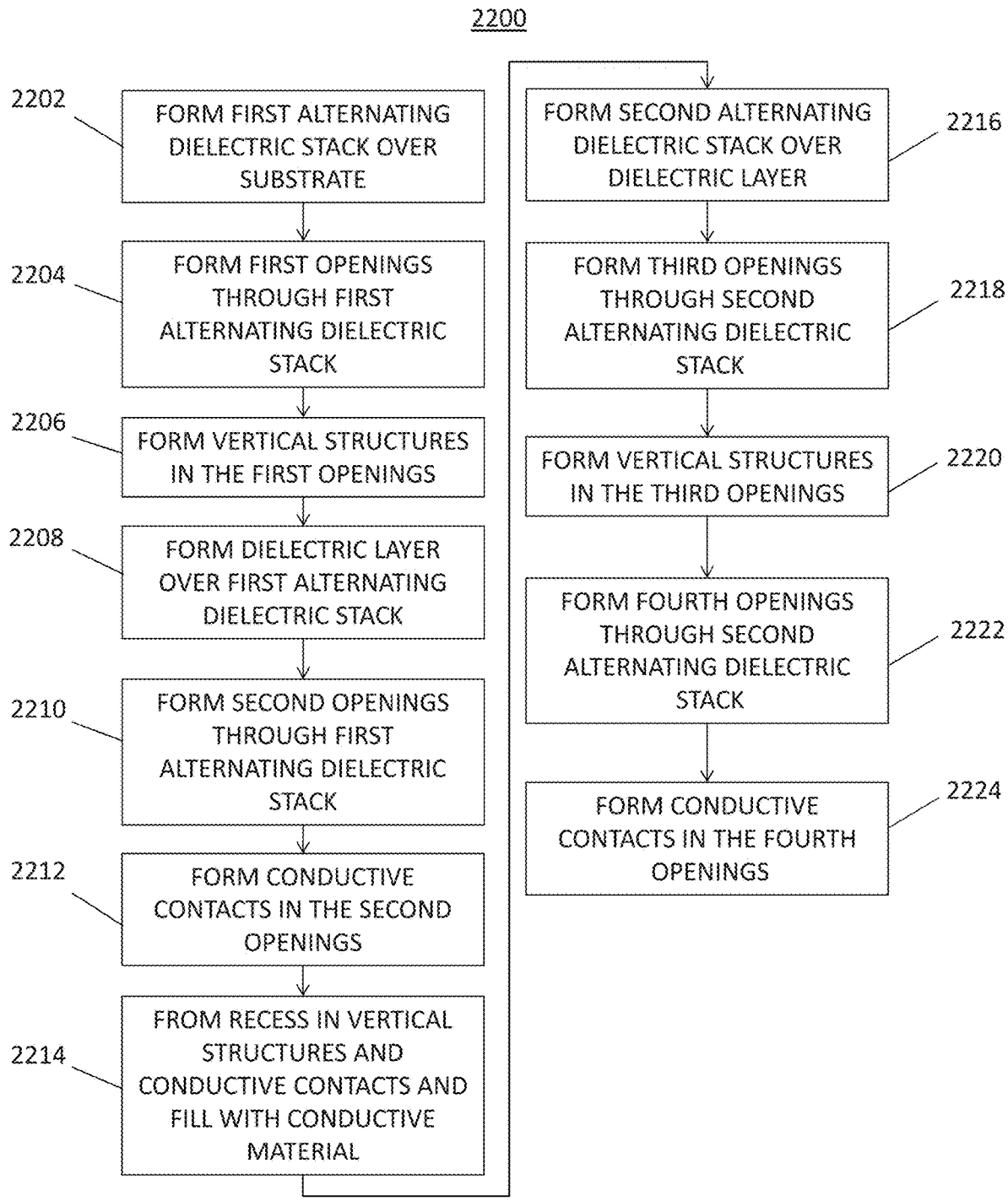
FIG. 22 is an illustration of a fabrication process for forming another three-dimensional memory structure, according to some embodiments.

FIGS. 21A and 21B illustrate an exemplary structure 2100 for forming another three-dimensional memory structure, according to some embodiments. The formation of insulator/conductor stack 1204 and second conductive contact 1206 are performed in the same way as described above with reference to FIGS. 11-12, and as such further description of their formation is not provided again.

FIG. 2.2 is a flowchart of an exemplary method 2200 for forming another NAND memory device, according to some embodiments. The operations of method 2200 are generally illustrated in FIGS. 14-21, although some of the operations were previously illustrated in FIGS. 2-12 and thus not repeated. It should be understood that the operations shown in method 2200 are not exhaustive and that other operations can be performed as well before, after, or between any of the illustrated operations. In various embodiments of the present disclosure, the operations of method 2200 can be performed in a different order and/or vary. It should be noted that the first eight operations of method 2200 (operations 2202-2208) are illustrated together in FIGS. 14A and 14B.

In operation 2202, a first alternating dielectric stack is formed over a substrate. The first alternating dielectric stack may include sacrificial dielectric layers alternating with dielectric layers having a different material composition. The layers of the first alternating dielectric stack can include materials including, but not limited to, silicon oxide, silicon nitride, silicon oxynitride, or any combination thereof. The layers of the first alternating dielectric stack can include dielectric materials deposited by one or more thin film deposition processes including, but not limited to, CVD, PVD, ALD, or any combination thereof.

According to some embodiments, the layers of the first alternating dielectric stack have a staircase structure where each of at least the sacrificial layers terminate at a different length in a horizontal direction over the surface of the substrate. This staircase structure allows for electrical contact to connect each of the word lines of the memory device.

In operation 2204, one or more first openings are etched through the alternating dielectric stack, thus exposing a surface of the substrate. Each of the one or more first openings may be etched through the alternating dielectric stack using an RTE process. In some embodiments, a material is epitaxially grown at the bottom of the one or more first openings on the exposed substrate. The epitaxially grown material may be epitaxially grown silicon.

In operation 2206, one or more vertical structures are formed within the one or more first openings. In some embodiments, the one or more vertical structures include one or more first NAND strings. Forming the one or more vertical structures may include first forming a plurality of memory layers over the sidewalls of the one or more first openings. Forming the plurality of memory layers may include depositing a semiconductor channel layer, such as amorphous silicon, polysilicon, or single crystalline silicon, a tunneling layer, a storage layer (also known as "charge trap/storage layer"), and a blocking layer. The blocking layer, the storage layer, the tunneling layer, and the semiconductor channel layer may each be deposited in the order listed on the sidewalls of the one or more first openings, according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, the plurality of memory layers includes silicon oxide/silicon nitride/silicon oxide (ONO) dielectrics (e.g., a tunneling layer including silicon oxide, a storage layer including silicon nitride, and a blocking layer including silicon oxide).

In operation 2208, a dielectric layer is formed over the first alternating dielectric stack. The dielectric layer may be may be oxide, and may be referred to as a capping dielectric layer. In some embodiments, a masking layer is deposited over the capping dielectric layer, and may be polysilicon, nitride, or any other material having a sufficiently large etch selectivity compared with the dielectric layer. Each of the capping dielectric layer and the masking layer may be formed using any suitable thin film deposition technique, such as sputtering, evaporation, or chemical vapor deposition (CVD). Example CVD techniques include plasma-enhanced CVD (PECVD), low pressure CVD (LPCVD), and atomic layer deposition (ALD).

In operation 2210, one or more second openings are formed through the first alternating dielectric stack and through the capping dielectric layer. The one or more second openings may be a trench etched through the first alternating dielectric stack. The one or more second openings exposes a portion of the substrate and may extend into the substrate, according to some embodiments. The one or more second openings may be formed using any suitable dry etching technique, including deep reactive ion etching (DIME) or inductively coupled plasma (ICP) etching, to name a few examples.

According to some embodiments, the exposed portion of the substrate around the bottom of the one or more second openings is doped to form a doped region within the substrate. The doped region may be formed using ion implantation or diffusion of dopants into the substrate. The dopants may include any p-type dopants (e.g., boron) or any n-type dopants (e.g., phosphorus.)

According to some embodiments, the sacrificial layers of the alternating first dielectric stack may be removed and replaced by conductor layers to form a first alternating conductor/insulator stack during, or directly after, operation 2010.

In operation 2212, one or more first conductive contacts are formed within the one or more second openings. Forming the one or more first conductive contacts may include forming a blocking layer followed by forming a core conductor that fills the remainder of the one or more second openings. The blocking layer may include oxide, or any other electrically insulating material. The core conductor may include a metal, such as tungsten, or any other conductive material such as Co, Cu, Al, doped silicon, silicides, or any combination thereof, to name a few examples. The blocking layer may be formed using any suitable deposition technique, such as sputtering, evaporation, or chemical vapor deposition (CVD). The core conductor may be formed using any suitable electroplating or electroless plating techniques. A CMP process may be performed after formation of the core conductor to planarize a top surface of the structure.

In operation 2214 recesses are formed in a top portion of the core conductor of the one or more first contacts, and are also formed through the capping dielectric layer substantially aligned over the one or more first NAND strings. Each of the formed recesses can be filled with a conductive material, such as, for example, polysilicon.

In operation 2216, a second alternating dielectric stack is formed over the capping dielectric layer. The second alternating dielectric stack may include sacrificial dielectric layers alternating with dielectric layers having a different material composition. The layers of the second alternating dielectric stack can include materials including, but not limited to, silicon oxide, silicon nitride, silicon oxynitride, or any combination thereof. The layers of the second alternating dielectric stack can include dielectric materials deposited by one or more thin film deposition processes including, but not limited to, CVD, PVD, ALD, or any combination thereof.

According to some embodiments, the layers of the second alternating dielectric stack have a staircase structure where each of at least the sacrificial layers terminate at a different length in a horizontal direction over the surface of the substrate. This staircase structure allows for electrical contact to connect each of the word lines of the memory device.

In operation 2218, one or more third openings are etched through the second alternating dielectric stack. The one or more third openings may be substantially aligned with the one or more first NAND strings formed in the one or more first openings. The one or more third openings may extend through the second alternating dielectric stack to expose a top surface of the conductive material within the etched recesses above the one or more first NAND strings. In some embodiments, the one or more third openings may extend into a thickness of the conductive material. The one or more third openings may be formed to have substantially the same diameter or cross-sectional shape as the vertical sacrificial structures.

In operation 2220, one or more second NAND strings are formed within the one or more third openings. The one or more second NAND strings may be formed using substantially the same processes and materials used to form one or more first NAND strings. In some embodiments, operation 2220 also includes recessing a top portion of the core insulator of the one or more second NAND strings using any suitable etching process and filling the recessed area with a conductive material, such as polysilicon. According to some embodiments, after formation of one or more second. NAND strings, an annealing process is performed to allow dopants from the conductive material between the NAND strings and on top of the one or more second NAND strings to diffusive into the semiconductor channels of the one or more first NAND strings and the one or more second NAND strings.

In operation 2222, one or more fourth openings are formed through the second alternating dielectric stack. The one or more fourth openings may be a trench etched through the second alternating dielectric stack. The one or more fourth openings may be substantially aligned over the one or more first conductive contacts formed within the one or more second openings. The one or more fourth openings exposes a portion of the one or more first conductive contacts, according to some embodiments. The one or more fourth openings may be formed using any suitable dry etching technique, including deep reactive ion etching (DRIE) or inductively coupled plasma (ICP) etching, to name a few examples. In some embodiments, the one or more fourth openings extend far enough to expose the core conductor of the one or more first conductive contacts.

According to some embodiments, the sacrificial layers of the second alternating dielectric stack may be removed and replaced by conductor layers to form a second alternating conductor/insulator stack during, or directly after, operation 2222.

In operation 2224, one or more second conductive contacts are formed within the one or more fourth openings. Forming the one or more second conductive contacts may include forming a blocking layer followed by forming a core conductor that fills the remainder of the one or more fourth openings. The blocking layer may include oxide, or any other electrically insulating material. The core conductor may include a metal, such as tungsten, or any other conductive material such as Co, Cu, Al, doped silicon, silicides, or any combination thereof, to name a few examples. The blocking layer may be formed using any suitable deposition technique, such as sputtering, evaporation, or chemical vapor deposition (CVD). The core conductor may be formed using any suitable electroplating or electroless plating techniques. A CMP process may be performed after formation of the core conductor to planarize a top surface of the structure. Forming the one or more second conductive contacts may include forming an omhic contact between the one or more first conductive contacts and the one or more second conductive contacts. The formation of the one or more second conductive contacts stacked on the one or more first conductive contacts forms an ACS for the memory device, according to some embodiments.

The present disclosure describes various embodiments of three-dimensional NAND memory device and methods of making the same. In some embodiments, a NAND memory device includes a substrate having a plurality of recess in a surface of the substrate. An epitaxially-grown material is formed in the plurality of recesses. The NAND memory device includes a first alternating conductor/dielectric stack disposed on the substrate and a dielectric layer disposed over the first alternating conductor/dielectric stack. A second alternating conductor/dielectric stack is disposed on the dielectric layer. The NAND memory device includes one or more structures extending orthogonally with respect to the surface of the substrate and over the epitaxially-grown material disposed in the plurality of recesses, and one or more conductive contacts extending orthogonally with respect to the surface of the substrate through the first alternating conductor/dielectric stack and the second alternating conductor/dielectric stack.

In some embodiments, the method to form the first three-dimensional memory device includes forming a first alternating sacrificial dielectric stack over a substrate, and forming one or more first openings through the first alternating sacrificial dielectric stack, the one or more first openings forming corresponding recesses in the substrate. The method also includes filling the one or more first recesses with an insulating material. The method includes forming a material in the corresponding recesses and forming one or more vertical sacrificial structures in the one or more first openings. The method further includes forming a dielectric layer over the first alternating sacrificial dielectric stack, and forming one or more second openings through the dielectric layer and through the first alternating sacrificial dielectric stack. The method further includes forming one or more first conductive contacts in the one or more second openings, and forming a second alternating sacrificial dielectric stack over the dielectric layer. The method also includes forming one or more third openings through the second alternating sacrificial dielectric stack. The one or more third openings are aligned with the one or more vertical sacrificial structures. The method also includes removing the one or more vertical sacrificial structures from the one or more first openings, and forming one or more vertical structures in the one or more first openings and in the one or more third openings aligned with the one or more first openings. The method also includes forming one or more fourth openings through the second alternating sacrificial dielectric stack and aligned with the one or more first conductive contacts, and forming one or more second conductive contacts in the one or more fourth openings. An ohmic contact is formed between the one or more first conductive contacts and the one or more second conductive contacts.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device, comprising:
   a substrate;
   a first layer stack above the substrate, having alternating conductor and insulator layers;
   a capping dielectric layer disposed over the first layer stack;
   a second layer stack, disposed over the capping dielectric layer, having alternating conductor and insulator layers; and
   one or more array common source contacts extending orthogonally with respect to the surface of the substrate through the first layer stack and the second layer stack, wherein at least one of the one or more array common source contacts comprises a first conductive contact and a second conductive contact that is disposed over and electrically connected with the first conductive contact.

2. The memory device of claim 1, wherein at least one of the one or more array common source contacts further comprises a first conductive material disposed over the first conductive contact and surrounding one end of the second conductive contact.

3. The memory device of claim 1, further comprising one or more first NAND strings extending through the first layer stack and one or more second NAND strings extending through the second layer stack, wherein each of the one or more second NAND strings is disposed over a respective NAND string of the one or more first NAND strings.

4. The memory device of claim 3, further comprising a second conductive material disposed between each of the one or more first NAND strings and one or more second NAND strings, wherein at least a portion of the second conductive material is disposed through the capping dielectric layer.

5. The memory device of claim 1, further comprising one or more NAND strings extending through the first layer stack and the second layer stack.

6. The memory device of claim 1, wherein the first conductive contact extends into a doped region in the substrate.

7. The memory device of claim 1, wherein each of the first conductive contact and the second conductive contact comprises tungsten.

8. The memory device of claim 1, wherein the first layer stack and the second layer stack include alternating layers of oxide and tungsten.

9. The memory device of claim 1, wherein the first layer stack and the second layer stack include alternating layers of vacuum and tungsten.

10. The memory device of claim 1, wherein the first layer stack and the second layer stack are arranged in a staircase pattern.

11. A method for forming a memory device, comprising:
    forming a first layer stack over a substrate, the first layer stack having alternating sacrificial and dielectric layers;
    forming a capping dielectric layer over the first layer stack;
    forming one or more first openings through the capping dielectric layer and through the first layer stack;
    forming one or more first conductive contacts in the one or more first openings;
    forming a second layer stack over the capping dielectric layer, the second layer stack having alternating sacrificial and dielectric layers;
    forming one or more second openings through the second layer stack and aligned with the one or more first conductive contacts; and
    forming one or more second conductive contacts in the one or more second openings, such that an ohmic contact is formed between the one or more first conductive contacts and the one or more second conductive contacts, wherein each of the one or more second conductive contacts aligned over the one or more first conductive contacts is an array common source contact.

12. The method of claim 11, further comprising:
    forming one or more third openings through the first layer stack, the one or more third openings forming corresponding recesses in the substrate;
    forming a material in the corresponding recesses;
    forming one or more first NAND strings in the one or more first openings.

13. The method of claim 12, further comprising:
    forming one or more recesses through the capping dielectric layer over the one or more first NAND strings; and
    filling the one or more recesses with a conductive material.

14. The method of claim 13, further comprising:
    forming one or more fourth openings through the second layer stack, the one or more fourth openings being aligned with the one or more first NAND strings; and
    forming one or more second NAND strings in the one or more fourth openings.

15. The method of claim 11, further comprising:
    forming one or more third openings through the first layer stack, the one or more third openings forming corresponding recesses in the substrate;
    forming a material in the corresponding recesses;
    forming one or more vertical sacrificial structures in the one or more third openings.

16. The method of claim 15, further comprising:
    forming one or more fourth openings through the second layer stack, the one or more fourth openings being aligned with the one or more vertical sacrificial structures;
    removing the one or more vertical sacrificial structures from the one or more third openings;
    forming one or more NAND strings in the one or more third openings and in the one or more fourth openings aligned with the one or more third openings.

17. The method of claim 11, further comprising:
after forming the one or more first openings, removing the sacrificial layers from the first layer stack, and replacing the removed sacrificial layers with conductive layers.

18. The method of claim 11, further comprising:
after forming the one or more first conductive contacts, removing a portion of the one or more first conductive contacts, and forming polysilicon over the one or more first conductive contacts.

19. The method of claim 18, wherein forming the one or more second openings further comprises forming the one or more second openings through the polysilicon.

20. The method of claim 19, wherein forming the one or more second conductive contacts comprises forming the one or more second conductive contacts such that the polysilicon surrounds a lower end of the one or more second conductive contacts.

\* \* \* \* \*